US012696379B2

(12) United States Patent
Arima et al.

(10) Patent No.: US 12,696,379 B2
(45) Date of Patent: Jul. 28, 2026

(54) HIGH FREQUENCY MODULE AND COMMUNICATION DEVICE

(71) Applicant: Murata Manufacturing Co., Ltd., Nagaokakyo (JP)

(72) Inventors: Keisuke Arima, Nagaokakyo (JP); Hiroyuki Kani, Nagaokakyo (JP); Tomoaki Sato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 204 days.

(21) Appl. No.: 18/656,618

(22) Filed: May 7, 2024

(65) Prior Publication Data

US 2024/0292519 A1     Aug. 29, 2024

Related U.S. Application Data

(63) Continuation of application No. PCT/JP2022/042320, filed on Nov. 15, 2022.

(30) Foreign Application Priority Data

Dec. 14, 2021     (JP) ................................. 2021-202699

(51) Int. Cl.
H05K 1/02          (2006.01)
H03F 3/24          (2006.01)

(52) U.S. Cl.
CPC ........... H05K 1/0243 (2013.01); H03F 3/245 (2013.01); H03F 2200/451 (2013.01); H05K 2201/09036 (2013.01)

(58) Field of Classification Search
CPC ......... H05K 1/0243; H05K 2201/0715; H05K 2201/09036
See application file for complete search history.

(56) References Cited

U.S. PATENT DOCUMENTS

| | | | |
|---|---|---|---|
| 2011/0006408 A1 | 1/2011 | Liao | |
| 2020/0020645 A1* | 1/2020 | Nakajima | ................. H03F 3/21 |
| 2020/0381336 A1* | 12/2020 | Otsubo | ................... H01L 23/42 |

FOREIGN PATENT DOCUMENTS

| | | |
|---|---|---|
| JP | 2006-190798 A | 7/2006 |
| JP | 2018-170419 A | 11/2018 |

(Continued)

OTHER PUBLICATIONS

International Search Report mailed on Jan. 31, 2023, received for International Application No. PCT/JP2022/042320, filed on Nov. 15, 2022, 12 pages including English Translation.

*Primary Examiner* — Nathan Milakovich
(74) *Attorney, Agent, or Firm* — XSENSUS LLP

(57)     ABSTRACT

A high frequency module includes a mounting board, a power amplifier, an electronic component, and a resin layer. The power amplifier is disposed on a main surface of either the first main surface or the second main surface of the mounting board. The electronic component is disposed on the main surface of the mounting board on which the power amplifier is disposed. The resin layer is disposed at least between the power amplifier and the electronic component in a plan view from a thickness direction of the mounting board. A groove portion is formed in the resin layer. The groove portion includes a bottom portion positioned between a third main surface of the power amplifier and the main surface of the mounting board when the mounting board is viewed from a direction orthogonal to the thickness direction of the mounting board.

19 Claims, 11 Drawing Sheets

(56)           References Cited

FOREIGN PATENT DOCUMENTS

| WO | 2019/167908 | A1 | 9/2019 |
|----|-------------|----|--------|
| WO | 2019/181589 | A1 | 9/2019 |

* cited by examiner

HIGH FREQUENCY MODULE AND COMMUNICATION DEVICE

CROSS-REFERENCE TO RELATED APPLICATIONS

This application is a continuation of international application no. PCT/JP2022/042320, filed Nov. 15, 2022, which claims priority to Japanese application no. 2021-202699, filed Dec. 14, 2021. The entire contents of both prior applications are hereby incorporated by reference.

TECHNICAL FIELD

The present disclosure generally relates to a high frequency module and a communication device, and more specifically relates to a high frequency module and a communication device including a mounting board and a power amplifier.

BACKGROUND ART

In the related art, a semiconductor device (a high frequency module) that increases heat insulation between a power amplifier and an electronic component is known.

In the conventional semiconductor device, a recess or a groove is provided on a surface of a mold resin (a resin layer) that covers the power amplifier and the electronic component.

SUMMARY

Technical Problem

In a configuration of the recess or the groove provided in the conventional semiconductor device (the high frequency module), there is a possibility that the heat generated by the power amplifier is transferred to the electronic component between the surface of the resin layer and the power amplifier, thereby heat insulation between the power amplifier and electronic component is insufficient.

The present disclosure is made in view of the above problem, and an object of the present disclosure is to provide a high frequency module and a communication device that can further improve heat insulation between a power amplifier and an electronic component.

Solution to Problem

A high frequency module according to an aspect of the present disclosure includes a mounting board, a power amplifier, an electronic component, and a resin layer. The mounting board has a first main surface and a second main surface opposite to each other. The power amplifier is disposed on a main surface of either the first main surface or the second main surface of the mounting board. The electronic component is disposed on the main surface of the mounting board on which the power amplifier is disposed. The resin layer is disposed at least between the power amplifier and the electronic component in a plan view from a thickness direction of the mounting board. The power amplifier has a third main surface and a fourth main surface opposite to each other in the thickness direction of the mounting board. The fourth main surface of the power amplifier is provided between the third main surface of the power amplifier and the main surface of the mounting board on which the power amplifier is disposed. A groove portion is formed at least between the power amplifier and the electronic component in the resin layer. The groove portion includes a bottom portion positioned between the third main surface of the power amplifier and the main surface of the mounting board when the mounting board is viewed from a direction orthogonal to the thickness direction of the mounting board.

A communication device according to another aspect of the present disclosure includes the high frequency module and a signal processing circuit. The signal processing circuit processes a high frequency signal passing through the high frequency module.

Advantageous Effects

According to the high frequency module and the communication device according to the above configuration of the present disclosure, the heat insulation between the power amplifier and the electronic component can be further improved.

DESCRIPTION OF EXEMPLARY EMBODIMENTS

Figure 1:
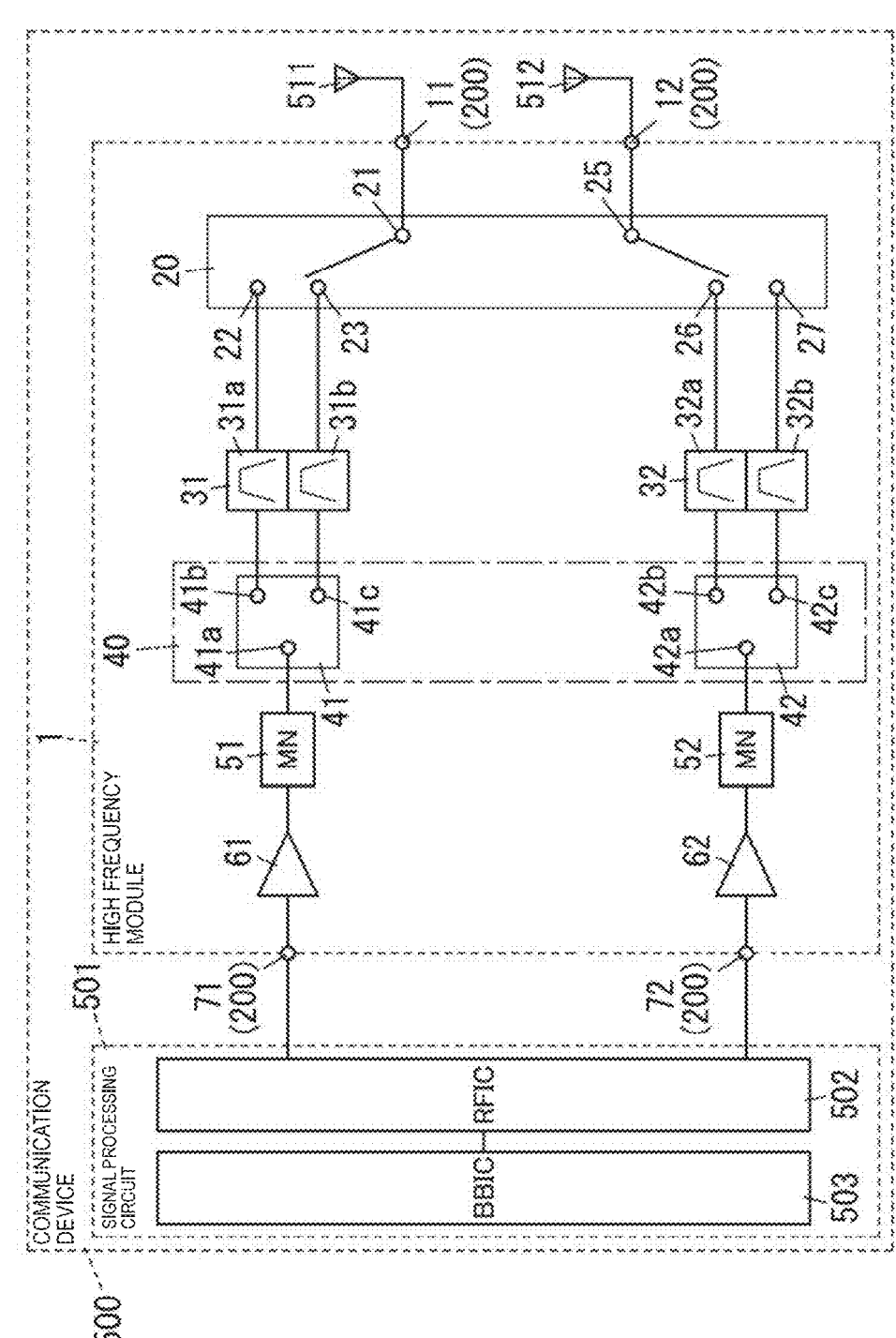
FIG. 1 is a circuit view explaining a configuration of a communication device including a high frequency module according to exemplary Embodiment 1.

FIGS. 2 to 9 and 11 referred to in the following exemplary embodiments or the like are all schematic views, and the size and thickness ratios of each configuration element in the drawings do not necessarily reflect the actual size ratios.

Embodiment 1

Hereinafter, a high frequency module and a communication device according to exemplary Embodiment 1 will be described with reference to FIGS. 1 to 5.

(1) Overview

As shown in FIG. 1, a high frequency module 1 of exemplary Embodiment 1 includes a plurality of (two in the illustrated example) antenna terminals (a first antenna terminal 11 and a second antenna terminal 12), a first switch 20, a first filter 31, a second filter 32, a second switch 40, a first matching circuit 51, a second matching circuit 52, a first power amplifier 61, and a second power amplifier 62. The high frequency module 1 includes one or a plurality of (two in the illustrated example) signal input terminals 71 and 72.

Figure 2:
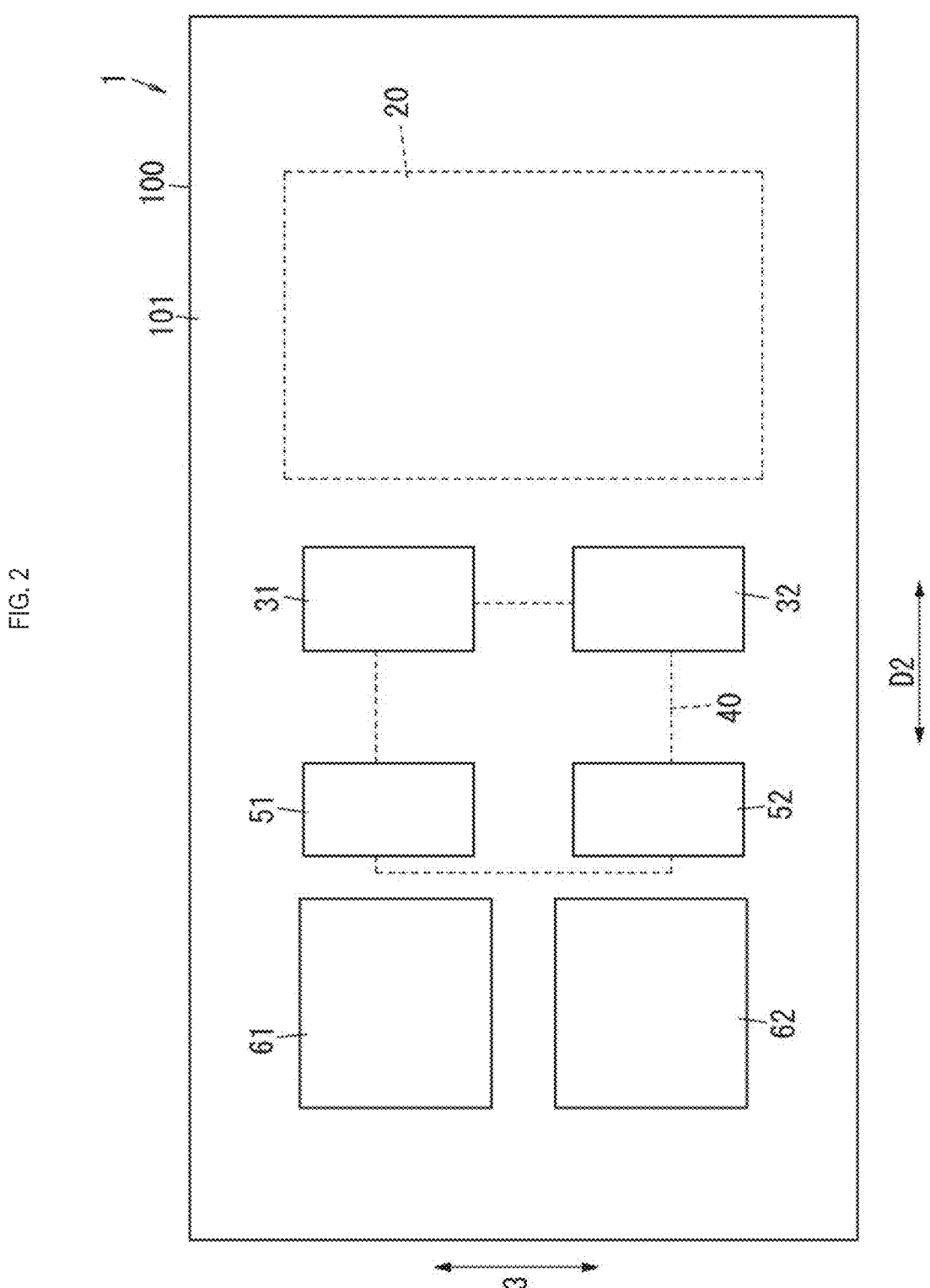
FIG. 2 is a plan view showing a disposition of a first power amplifier, a second power amplifier, and an electronic component on a mounting board included in the high frequency module same as above.
Figure 3:
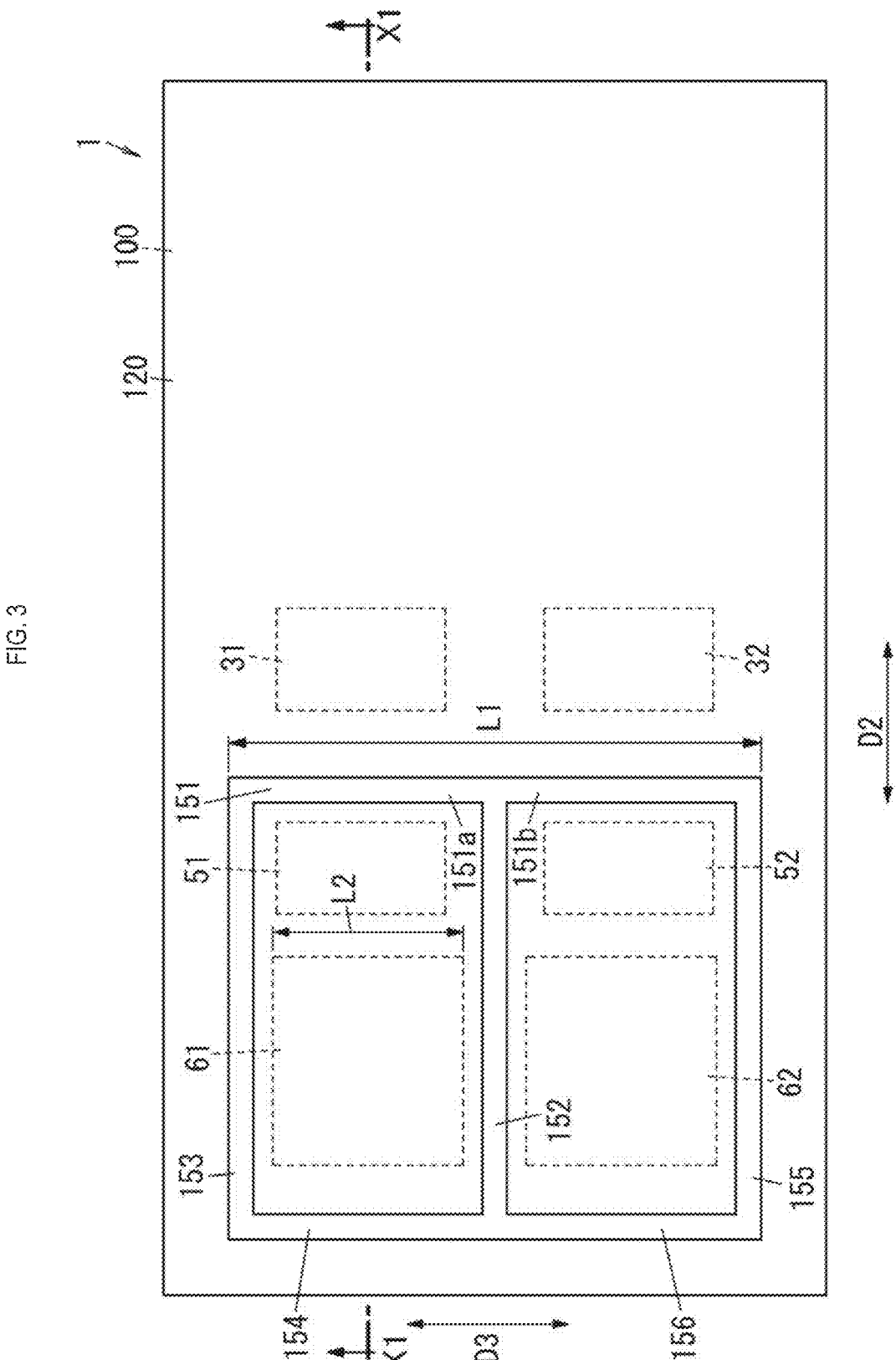
FIG. 3 is a plan view showing a disposition of a groove portion on a first main surface of the mounting board included in the high frequency module same as above.
Figure 4:
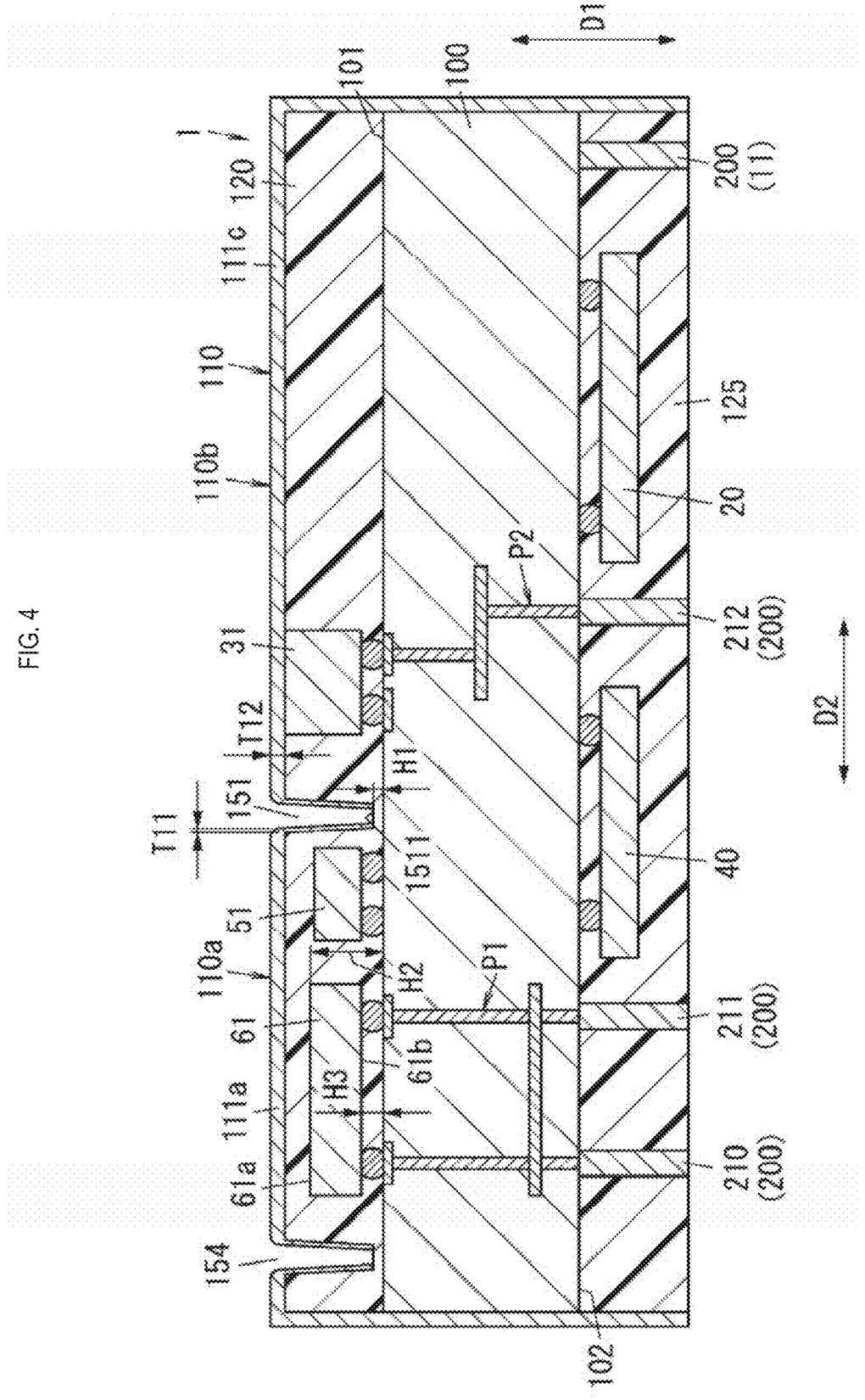
FIG. 4 is a cross-sectional view taken along the line X1-X1 in FIG. 3.

As shown in FIGS. 2 to 4, the high frequency module 1 further includes a mounting board 100 and a first resin layer 120.

The mounting board 100 has a first main surface 101 and a second main surface 102 that are opposite to each other in a thickness direction D1 (hereinafter, also referred to as a first direction D1) of the mounting board 100 (see FIG. 4). In exemplary Embodiment 1, a plurality of electronic components are disposed on the first main surface 101 of the mounting board 100 and the second main surface 102 of the mounting board 100. Here, the fact that "'A' is disposed on the first main surface 101 (the second main surface 102) of the mounting board 100" means that 'A' is directly mounted on the first main surface 101 (the second main surface 102) of the mounting board 100 and also means that 'A' is disposed, among a space on a side of the first main surface 101 and a space on a side of the second main surface 102 separated in the mounting board 100, in the space on the side of the first main surface 101 (the second main surface 102). That is, that fact includes that 'A' is mounted on the first main surface 101 (the second main surface 102) of the mounting board 100 with other circuit elements, electrodes, or the like interposed therebetween.

The first power amplifier 61 and the second power amplifier 62 are disposed on a main surface of either the first main surface 101 or the second main surface 102 of the mounting board 100. In exemplary Embodiment 1, the first power amplifier 61 and the second power amplifier 62 are disposed on the first main surface 101 of the mounting board 100.

The first power amplifier 61 is integrated into one chip and formed in a cubic shape. The first power amplifier 61 has an upper surface (a third main surface) 61a and a lower surface (a fourth main surface) 61b that are opposite to each other in the thickness direction D1 of the mounting board 100 (see FIG. 4). The lower surface (the fourth main surface) 61b of the first power amplifier 61 is provided between the upper surface (the third main surface) of the first power amplifier 61 and the main surface (the first main surface 101) on which the first power amplifier 61 is disposed.

The second power amplifier 62 is integrated into one chip and formed in a cubic shape. The second power amplifier 62 has an upper surface (a third main surface) and a lower surface (a fourth main surface) that are opposite to each other in the thickness direction D1 of the mounting board 100. The lower surface (the fourth main surface) of the second power amplifier 62 is provided between the upper surface (the third main surface) of the second power amplifier 62 and the main surface (the first main surface 101) on which the second power amplifier 62 is disposed.

The plurality of electronic components are disposed on the main surface (here, the first main surface 101) of the mounting board 100 on which the first power amplifier 61 and the second power amplifier 62 are disposed. Here, the plurality of electronic components include the first filter 31, the second filter 32, the first matching circuit 51, and the second matching circuit 52. That is, the first filter 31, the second filter 32, the first matching circuit 51, and the second matching circuit 52 are disposed on the first main surface 101 of the mounting board 100.

The plurality of electronic components, which are disposed on the second main surface 102 of the mounting board 100, include second electronic components different from first electronic components, which are used as electronic components disposed on the first main surface 101 of the mounting board 100. That is, the high frequency module 1 includes the second electronic component different from the first electronic component. The second electronic component is disposed on a main surface different from the main surface on which the first power amplifier 61 and the second power amplifier 62 are disposed, among the first main surface 101 and the second main surface 102 of the mounting board 100. The second electronic component includes a first switch 20 and a second switch 40. In other words, the first switch 20 and the second switch 40 as the second electronic component are disposed on the second main surface 102 of the mounting board 100.

The high frequency module 1 according to exemplary Embodiment 1 is used, for example, in a multimode/multiband communication device 500. Although the communication device 500 is, for example, a mobile phone (for example, a smartphone), the communication device 500 is not limited to the mobile phone and may be, for example, a wearable terminal (for example, a smartwatch), or the like. The high frequency module 1 is, for example, a module capable of supporting a fourth generation mobile communication (4G) standard, a fifth generation mobile communication (5G) standard, and the like. The 4G standard is, for example, a third generation partnership project (3GPP) (registered trademark) long term evolution (LTE) standard (registered trademark). The 5G standard is, for example, the 5G new radio (NR).

The first antenna terminal 11 is electrically connected to a first antenna 511 (see FIG. 1). Further, the second antenna terminal 12 is electrically connected to a second antenna 512 (see FIG. 1). Here, the fact that "'A' is connected to 'B'" is defined as indicating that 'A' and 'B' are in contact and also defined to include that 'A' and 'B' are electrically connected with a conductor electrode, a conductor terminal, a wiring, other circuit components, or the like interposed therebetween.

The first switch 20 is configured such that the first filter 31 and the second filter 32 are connectable to each of the first antenna 511 and the second antenna 512. The first switch 20 is configured such that the first filter 31 is connectable to the first antenna 511 and the second filter 32 is connectable to the second antenna 512 at the same time. That is, the high frequency module 1 is a module capable of supporting carrier aggregation and dual connectivity. Here, the carrier aggregation and the dual connectivity mean communication that simultaneously uses radio waves in a plurality of frequency bands. Hereinafter, the transmission of signals through the carrier aggregation or the dual connectivity is also referred to as simultaneous transmission. "Can perform simultaneous transmission" means that signal transmission through the carrier aggregation or the dual connectivity is possible.

The high frequency module 1 according to exemplary Embodiment 1 simultaneously performs communication (transmission) of signals in a frequency band defined in 4G and communication (transmission) of signals in a frequency band defined in 5G. Further, the high frequency module 1 may simultaneously perform communication of signals in a frequency band defined in 4G and communication of signals in a frequency band defined in 4G. The high frequency module 1 may simultaneously perform communication of signals in a frequency band defined with 5G and communication of signals in other frequency band defined in 5G.

The first resin layer 120 is disposed on a side of the first main surface 101 of the mounting board 100. The first resin layer 120 is disposed at least between the first power amplifier 61 and the second power amplifier 62, and the electronic components in a plan view from the thickness direction D1 of the mounting board 100. Specifically, the first resin layer 120 is disposed at least between the first power amplifier 61 and the second power amplifier 62, and the first filter 31 and the second filter 32, in a direction in which the first power amplifier 61 and the second power amplifier 62, and the first filter 31 and the second filter 32 are arranged. In exemplary Embodiment 1, the first resin layer 120 covers at least a part of the first filter 31, the second filter 32, the first matching circuit 51, the second matching circuit 52, the first power amplifier 61, and the second power amplifier 62. Here, "in a plan view from the thickness direction D1 of the mounting board 100" means that the mounting board 100 and the components disposed on the mounting board 100 are orthographically projected and viewed on a plane parallel to the main surface (for example, the first main surface 101) of the mounting board 100. Further, the fact that "a configuration element C is disposed between a configuration element A and a configuration element B in a plan view from the thickness direction D1 of the mounting board 100" means that at least one line segment among a plurality of line segments connecting any point in the configuration element A and any point in the configuration element B in a plan view from the thickness direction D1 of the mounting board 100 passes through a region of the configuration element C.

In the first resin layer 120, a groove portion 151 is formed between the first power amplifier 61 and the second power amplifier 62, and the first filter 31 and the second filter 32 (see FIGS. 3 and 4). A first distance H1 (see FIG. 4), which is from a bottom portion 1511 of the groove portion 151 (see FIGS. 4 and 5) to the main surface (the first main surface 101) of the mounting board 100 on which the power amplifier is disposed, is shorter than a second distance H2, which is from an upper surface 61a of the first power amplifier 61 to the main surface (the first main surface 101) of the mounting board 100 on which the first power amplifier 61 is disposed (see FIG. 4). The first distance H1 is shorter than a distance, which is from an upper surface of the second power amplifier 62 to the main surface (the first main surface 101) of the mounting board 100 on which the second power amplifier 62 is disposed. In other words, the groove portion 151 includes the bottom portion 1511 (see FIGS. 4 and 5) positioned between the upper surface of the first power amplifier 61 and the upper surface of the second power amplifier 62, and the first main surface 101 of the mounting board 100 when the mounting board 100 is viewed from a direction orthogonal to the thickness direction D1 of the mounting board 100.

(2) Configuration

Hereinafter, configurations of the high frequency module 1 and the communication device 500 according to exemplary Embodiment 1 will be described with reference to FIGS. 1 to 5.

The high frequency module 1 is configured, for example, to amplify a transmission signal (a high frequency signal), which is input from the signal processing circuit 501 (see FIG. 1), and output the amplified signal to the first antenna 511 and the second antenna 512. The signal processing circuit 501 is not a configuration element of the high frequency module 1 but a configuration element of the communication device 500 including the high frequency module 1. The high frequency module 1 is controlled by, for example, the signal processing circuit 501 included in the communication device 500. The communication device 500 includes the high frequency module 1 and the signal processing circuit 501. The communication device 500 further includes the first antenna 511 and the second antenna 512. The communication device 500 further includes a circuit board on which the high frequency module 1 is mounted. The circuit board is, for example, a printed wiring board. The circuit board includes a ground electrode to which a ground potential is applied.

The first antenna 511 is connected to the first antenna terminal 11 of the high frequency module 1. The second antenna 512 is connected to the second antenna terminal 12 of the high frequency module 1. The first antenna 511 and the second antenna 512 have a transmission function of radiating the transmission signal output from the high frequency module 1 as radio waves.

The signal processing circuit 501 processes a high frequency signal (for example, a transmission signal) passing through the high frequency module 1. The signal processing circuit 501 includes, for example, an RF signal processing circuit 502 and a baseband signal processing circuit 503. The RF signal processing circuit 502 is, for example, a radio frequency integrated circuit (RFIC) and performs signal processing on a high frequency signal. The RF signal processing circuit 502 performs signal processing, such as up-conversion, on the high frequency signal (the transmission signal) output from the baseband signal processing circuit 503, and outputs the high frequency signal on which the signal processing is performed.

The baseband signal processing circuit 503 is, for example, a baseband integrated circuit (BBIC). The baseband signal processing circuit 503 generates an I-phase signal and a Q-phase signal from baseband signals. The baseband signal is, for example, an audio signal, an image signal, and the like input from the outside. The baseband signal processing circuit 503 performs IQ modulation processing by combining the I-phase signal and the Q-phase signal and outputs a transmission signal. In this case, the transmission signal is generated as a modulation signal (IQ signal) by amplitude modulation of a carrier wave signal of a predetermined frequency in a period longer than a period of the carrier wave signal.

In the communication device 500, the baseband signal processing circuit 503 is not an essential configuration element.

As shown in FIG. 1, the high frequency module 1 includes the first antenna terminal 11, the second antenna terminal 12, the first switch 20, the first filter 31, the second filter 32, the second switch 40, the first matching circuit 51, the second matching circuit, and the first power amplifier 61. The high frequency module 1 further includes the second power amplifier 62 different from the first power amplifier 61. The high frequency module 1 further includes one or a plurality of (two in the illustrated example) signal input terminals 71.

The first antenna terminal 11 is electrically connected to the first antenna 511 and the second antenna terminal 12 is electrically connected to the second antenna 512, respectively.

The first switch 20 is a switch integrated circuit (IC) configured with one chip. The first switch 20 is configured such that the first filter 31 is connectable to the first antenna 511. The first switch 20 is configured such that the second filter 32 is connectable to the second antenna 512. The first switch 20 is configured such that the first filter 31 and the second filter 32 are connectable to the first antenna 511 and the second antenna 512 at the same time. That is, the first switch 20 is a switch IC that includes a switch that enables the first filter 31 and the second filter 32 to be connectable to the first antenna 511 and the second antenna 512.

The first switch 20 is electrically connected to the first antenna terminal 11 and the second antenna terminal 12. The first switch 20 is electrically connected to the first filter 31 and the second filter 32. Specifically, the first switch 20 includes a first common terminal 21, a plurality of (two in the illustrated example) first selection terminals 22 and 23, a second common terminal 25, and a plurality of (in the illustrated example, two) second selection terminals 26 and 27. The first switch 20 selects at least one terminal among the first selection terminal 22 and the first selection terminal 23 as a connection destination of the first common terminal 21 under the control of the signal processing circuit 501. The first switch 20 selects at least one terminal among the second selection terminal 26 and the second selection terminal 27 as a connection destination of the second common terminal 25 under the control of the signal processing circuit 501.

The first common terminal 21 is electrically connected to the first antenna terminal 11. That is, the first common terminal 21 is electrically connected to the first antenna 511 with the first antenna terminal 11 interposed therebetween. The first common terminal 21 may be connected to the first antenna terminal 11 with a low pass filter, a coupler, or the like interposed therebetween.

The first selection terminals 22 and 23 are electrically connected to the first filter 31. Specifically, the first selection terminal 22 is electrically connected to a first transmission filter 31*a* included in the first filter 31, which will be described later. The first selection terminal 23 is electrically connected to a second transmission filter 31*b* included in the first filter 31, which will be described later.

The second common terminal 25 is electrically connected to the second antenna terminal 12. That is, the second common terminal 25 is electrically connected to the second antenna 512 with the second antenna terminal 12 interposed therebetween. The second common terminal 25 may be connected to the second antenna terminal 12 with the low pass filter, the coupler, or the like interposed therebetween.

The second selection terminals 26 and 27 are electrically connected to the second filter 32. Specifically, the second selection terminal 26 is electrically connected to a third transmission filter 32*a* included in the second filter 32, which will be described later. The second selection terminal 27 is electrically connected to a fourth transmission filter 32*b* included in the second filter 32, which will be described later.

The first filter 31 includes a first transmission filter 31*a* and a second transmission filter 31*b*.

The first transmission filter 31*a* is a transmission filter that passes a transmission signal (a first transmission signal) in a first frequency band output from the first power amplifier 61. The first transmission filter 31*a* passes, for example, the first transmission signal in a transmission band (1920 MHz to 1980 MHz) of Band 1 which is a mid-band frequency band defined in 4G. The first transmission filter 31*a* is electrically connected to the first selection terminal 22 of the first switch 20 and passes the first transmission signal. The first transmission filter 31*a* is, for example, a ladder filter and includes a plurality of (for example, four) series arm resonators and a plurality of (for example, three) parallel arm resonators. The first transmission filter 31*a* is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, a surface acoustic wave (SAW) resonator. The first transmission filter 31*a* is not limited to an SAW filter. The first transmission filter 31*a* may be, for example, a bulk acoustic wave (BAW) filter other than an SAW filter. A resonator in the BAW filter is, for example, a film bulk acoustic resonator (FBAR) or a solidly mounted resonator (SMR). The BAW filter includes a board. The board included in the BAW filter is, for example, a silicon board.

The second transmission filter 31*b* is a transmission filter that passes a transmission signal (a second transmission signal) in a second frequency band output from the first power amplifier 61. The second transmission filter 31*b* passes, for example, the second transmission signal in a transmission band (1710 MHz to 1785 MHz) of Band 3 defined in the 4G standard. The second transmission filter 31*b* is electrically connected to the first selection terminal 23 of the first switch 20 and passes the second transmission signal. The second transmission filter 31*b* is, for example, a ladder filter and includes a plurality of (for example, four) series arm resonators and a plurality of (for example, three) parallel arm resonators. The second transmission filter 31*b* is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, an SAW resonator. The second transmission filter 31*b* is not limited to an SAW filter. The second transmission filter 31*b* may be, for example, a BAW filter other than an SAW filter.

The second filter 32 includes a third transmission filter 32*a* and a fourth transmission filter 32*b*.

The third transmission filter 32*a* is a transmission filter that passes a transmission signal (a third transmission signal) in a third frequency band output from the second power amplifier 62. The third transmission filter 32*a* passes, for example, the third transmission signal of n41 (a frequency band 2496 to 2690 MHz) which is a high-band frequency band standardized in 5G. The third transmission filter 32*a* is electrically connected to the second selection terminal 26 of the first switch 20 and passes the third transmission signal. The third transmission filter 32*a* is, for example, a ladder filter and includes a plurality of (for example, four) series arm resonators and a plurality of (for example, three) parallel arm resonators. The third transmission filter 32*a* is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, an SAW resonator. The third transmission filter 32*a* is not limited to an SAW filter. The third transmission filter 32*a* may be, for example, a BAW filter other than an SAW filter.

The fourth transmission filter 32*b* is a transmission filter that passes a transmission signal (a fourth transmission signal) in a fourth frequency band output from the second power amplifier 62. The fourth transmission filter 32*b* passes, for example, the fourth transmission signal of n41 (a frequency band of 2300 to 2400 MHz) which is a high-band frequency band standardized in 5G. The fourth transmission filter 32*b* is electrically connected to the second selection terminal 27 of the first switch 20 and passes the fourth transmission signal. The fourth transmission filter 32*b* is, for example, a ladder filter and includes a plurality of (for example, four) series arm resonators and a plurality of (for example, three) parallel arm resonators. The fourth transmission filter 32*b* is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, an SAW resonator. The fourth transmission filter 32*b* is not limited to an SAW filter. The fourth transmission filter 32*b* may be, for example, a BAW filter other than an SAW filter.

The second switch 40 is configured with one chip. As shown in FIG. 1, the second switch 40 includes a third switch 41 and a fourth switch 42. The third switch 41 switches a filter connected to the first power amplifier 61. The fourth switch 42 switches a filter connected to the second power amplifier 62. The second switch 40 may be configured with one chip together with a controller (not shown) that controls the first power amplifier 61 and the second power amplifier according to a control signal from the signal processing circuit 501.

The third switch 41 includes a third common terminal 41*a*, and a plurality of (two in the illustrated example) third selection terminals 41*b* and 41*c*. The third switch 41 selects at least one of the plurality of third selection terminals 41*b* and 41*c* as a connection destination of the third common terminal 41*a* under the control of the signal processing circuit 501. The third common terminal 41*a* is electrically connected to the first power amplifier 61. The plurality of third selection terminals 41*b* and 41*c* are electrically connected to the first antenna terminal 11 with the first switch 20 interposed therebetween. That is, the plurality of third selection terminals 41*b* and 41*c* are electrically connected to the first antenna 511 with the first antenna terminal 11 interposed therebetween. Specifically, the third selection terminal 41*b* is electrically connected to the first transmission filter 31*a* of the first filter 31. The third selection terminal 41*b* is electrically connected to the first antenna 511 with the first transmission filter 31*a* interposed therebetween. The third selection terminal 41*c* is electrically connected to the second transmission filter 31*b* of the first filter 31, and the third selection terminal 41*c* is electrically connected to the first antenna 511 with the second transmission filter 31*b* interposed therebetween.

The fourth switch 42 includes a fourth common terminal 42*a* and a plurality of (two in the illustrated example) fourth selection terminals 42*b* and 42*c*. The fourth switch 42 selects at least one of the plurality of fourth selection terminals 42*b* and 42*c* as a connection destination of the fourth common terminal 42*a* under the control of the signal processing circuit 501. The fourth common terminal 42*a* is electrically connected to the second power amplifier 62. The plurality of fourth selection terminals 42*b* and 42*c* are electrically connected to the second antenna terminal 12 with the first switch 20 interposed therebetween. That is, the plurality of fourth selection terminals 42*b* and 42*c* are electrically connected to the second antenna 512 with the second antenna terminal 12 interposed therebetween. Specifically, the fourth selection terminal 42*b* is electrically connected to the third transmission filter 32*a* of the second filter 32. The fourth selection terminal 42*b* is electrically connected to the second antenna 512 with the third transmission filter 32*a* interposed therebetween. The fourth selection terminal 42*c* is electrically connected to the fourth transmission filter 32*b* of the second filter 32, and the fourth selection terminal 42*c* is electrically connected to the second antenna 512 with the fourth transmission filter 32*b* interposed therebetween.

The first matching circuit 51 is electrically connected in a path between the third switch 41 included in the second switch 40 and the first power amplifier 61 and performs impedance matching between the third switch 41 and the first power amplifier 61. One end of the first matching circuit 51 is connected to an output terminal of the first power amplifier 61. The other end of the first matching circuit 51 is connected to the third common terminal 41*a* of the third switch 41.

The second matching circuit 52 is electrically connected in a path between the fourth switch 42 included in the second switch 40 and the second power amplifier 62 and performs impedance matching between the fourth switch 42 and the second power amplifier 62. One end of the second matching circuit 52 is connected to an output terminal of the second power amplifier 62. The other end of the second matching circuit 52 is connected to the fourth common terminal 42*a* of the fourth switch 42.

The first power amplifier 61 is an amplifier that amplifies the transmission signals (the first transmission signal and the second transmission signal) output from the RF signal processing circuit 502 of the signal processing circuit 501. An input terminal of the first power amplifier 61 is electrically connected to the signal input terminal 71. An output terminal of the first power amplifier 61 is electrically connected to the first matching circuit 51. That is, the first power amplifier 61 is electrically connected to the first filter 31 with the first matching circuit 51 interposed therebetween. That is, the first power amplifier 61 is electrically connected to the first switch 20 with the first filter 31 interposed therebetween.

The second power amplifier 62 is an amplifier that amplifies the transmission signals (the third transmission signal and the fourth transmission signal) output from the RF signal processing circuit 502 of the signal processing circuit 501. The second power amplifier 62 is disposed on the main surface (the first main surface 101) on which the first power amplifier 61 is disposed. An input terminal of the second power amplifier 62 is electrically connected to the signal input terminal 72. An output terminal of the second power amplifier 62 is electrically connected to the second matching circuit 52. That is, the second power amplifier 62 is electrically connected to the second filter 32 with the second matching circuit 52 interposed therebetween. That is, the second power amplifier 62 is electrically connected to the first switch 20 with the second filter 32 interposed therebetween.

The high frequency module 1 further includes the mounting board 100 as shown in FIGS. 2 to 4. The mounting board 100 has the first main surface 101 and the second main surface 102 that are opposite to each other in the thickness direction D1 of the mounting board 100.

The mounting board 100 is, for example, a printed wiring board, a low temperature co-fired ceramics (LTCC) board, a high temperature co-fired ceramics (HTCC) board, or a resin multilayer board. Here, the mounting board 100 is, for example, a ceramic board that is a multilayer board including a plurality of dielectric layers and a plurality of conductive layers. The plurality of dielectric layers and the plurality of conductive layers are laminated in the thickness direction D1 of the mounting board 100. The plurality of conductive layers are formed in a predetermined pattern determined for each layer. Each of the plurality of conductive layers includes one or a plurality of conductor portions in one plane orthogonal to the thickness direction D1 of the mounting board 100. A material of each conductive layer is, for example, copper. The plurality of conductive layers include a ground layer. In the high frequency module 1, one or more ground terminals 210, 211, and 212 included in a plurality of external connection terminals 200 (see FIG. 4) and the ground layer are electrically connected with the via conductor, the pad, and the like, which are included in the mounting board 100, interposed therebetween.

The mounting board 100 is not limited to a printed wiring board or an LTCC board and may be a wiring structure. The wiring structure is, for example, a multilayer structure. The multilayer structure includes at least one insulation layer and at least one conductive layer. The insulation layer is formed in a predetermined pattern. In a case where the number of insulation layers is plural, the plurality of insulation layers are formed in a predetermined pattern determined for each layer. The conductive layer is formed in a predetermined pattern different from the predetermined pattern of the insulation layer. In a case where the number of conductive layers is plural, the plurality of conductive layers are formed in a predetermined pattern determined for each layer. The conductive layer may include one or a plurality of rewiring portions. In the wiring structure, a first surface of two surfaces, which are opposite to each other in a thickness direction of the multilayer structure, is the first main surface 101 of the mounting board 100, and a second surface is the second main surface 102 of the mounting board 100. The wiring structure may be, for example, an interposer. The interposer may be an interposer using a silicon board or may be a board having multiple layers.

The first main surface 101 and the second main surface 102 of the mounting board 100 are separated in the thickness direction D1 of the mounting board 100 and intersect the thickness direction D1 of the mounting board 100. Although the first main surface 101 of the mounting board 100 is, for example, orthogonal to the thickness direction D1 of the mounting board 100, the first main surface 101 of the mounting board 100 may include, for example, a side surface or the like of the conductor portion as a surface that is not orthogonal to the thickness direction D1. Further although the second main surface 102 of the mounting board 100 is, for example, orthogonal to the thickness direction D1 of the mounting board 100, the second main surface 102 of the mounting board 100 may include, for example, a side surface or the like of the conductor portion as a surface that is not orthogonal to the thickness direction D1. Further, the first main surface 101 and the second main surface 102 of the mounting board 100 may have fine unevenness, a recess portion, or a projection portion. Although the mounting board 100 has an oblong shape in a plan view from the thickness direction D1 of the mounting board 100, the shape is not limited to the oblong shape and may be, for example, a square shape.

The first power amplifier 61 and the second power amplifier 62 are disposed on the first main surface 101 of the mounting board 100.

The high frequency module 1 includes the plurality of electronic components disposed on the first main surface 101 of the mounting board 100. The plurality of electronic components, which are disposed on the first main surface 101 of the mounting board 100, include transmission electronic components related to transmission of the transmission signal. The transmission electronic component includes the first filter 31, the second filter 32, the first matching circuit 51, and the second matching circuit 52. That is, the first filter 31, the second filter 32, the first matching circuit 51, and the second matching circuit 52 are disposed on the first main surface 101 of the mounting board 100 in addition to the first power amplifier 61 and the second power amplifier 62. In a plan view from the thickness direction D1 of the mounting board 100, an outer peripheral shape of each of the first filter 31, the second filter 32, the first matching circuit 51, and the second matching circuit 52, in addition to the first power amplifier 61 and the second power amplifier 62, is a rectangular shape (an oblong shape).

Each of the first power amplifier 61, the second power amplifier 62, the first filter 31, the second filter 32, the first matching circuit 51, and the second matching circuit 52 is flip-chip mounted on the first main surface 101 of the mounting board 100. That is, the first power amplifier 61 and the second power amplifier 62 are flip-chip mounted on the first main surface 101 of the mounting board 100. Further, each of the plurality of electronic components (the first filter 31, the second filter 32, the first matching circuit 51, and the second matching circuit 52), which is disposed on the first main surface 101 of the mounting board 100 on which the first power amplifier 61 and the second power amplifier 62 are disposed, is flip-chip mounted on the first main surface 101 of the mounting board 100.

The first power amplifier 61, the first matching circuit 51, and the first filter 31 are disposed on the first main surface 101 of the mounting board 100 along a second direction D2 that intersects with the first direction D1, which is the thickness direction D1 of the mounting board 100 (see FIG. 2). The second power amplifier 62, the second matching circuit 52, and the second filter 32 are disposed on the first main surface 101 of the mounting board 100 along the second direction D2 (see FIG. 2). The first power amplifier 61 and the second power amplifier 62 are disposed on the first main surface 101 of the mounting board 100 along a third direction D3 that intersects with both the first direction D1 and the second direction D2 (see FIG. 2). The first matching circuit 51 and the second matching circuit 52 are disposed on the first main surface 101 of the mounting board 100 along the third direction D3 (see FIG. 2). The first filter 31 and the second filter 32 are disposed on the first main surface 101 of the mounting board 100 along the third direction D3 (see FIG. 2).

The high frequency module 1 includes the plurality of electronic components disposed on the second main surface 102 of the mounting board 100. The plurality of electronic components, which are disposed on the second main surface 102 of the mounting board 100, include the first switch 20 and the second switch 40. In a plan view from the thickness direction D1 of the mounting board 100, an outer peripheral shape of each of the first switch 20 and the second switch 40 is a rectangular shape (an oblong shape).

The first switch 20 and the second switch 40 are disposed on the second main surface 102 of the mounting board 100 along the second direction. Further, in a plan view from the first direction of the mounting board 100, the second switch 40 overlaps at least a part of each of the first filter 31, the second filter 32, the first matching circuit 51, and the second matching circuit 52.

The plurality of external connection terminals 200 are formed in a prismatic shape and are disposed on the second main surface 102. More specifically, materials of the plurality of external connection terminals 200 are, for example, metal (for example, copper, copper alloy).

The plurality of external connection terminals 200 include a first antenna terminal 11, a second antenna terminal 12, one or more ground terminals 210, 211, and 212, and a plurality of signal input terminals 71 and 72. The one or more ground terminals 210, 211, and 212 are connected to the ground layer of the mounting board 100 as described above. The ground layer is a circuit ground of the high frequency module 1. The plurality of external connection terminals 200 are electrically connected to a circuit board (not shown) included in the communication device 500. The one or more ground terminals 210, 211, and 212 included in the plurality of external connection terminals 200 are terminals that are electrically connected to a ground electrode of the circuit board included in the communication device 500 and to which a ground potential is applied.

The high frequency module 1 further includes a first resin layer 120 as shown in FIGS. 3 and 4. In FIG. 2, the first resin layer 120 is omitted. The first resin layer 120 is disposed on a side of the first main surface 101 of the mounting board 100. Specifically, the first resin layer 120 is disposed at least between the first power amplifier 61 and the second power amplifier 62, and the first filter 31 and the second filter 32, in a direction in which the first power amplifier 61 and the second power amplifier 62, and the first filter 31 and the second filter 32 are arranged, in a plan view from the thickness direction D1 of the mounting board 100. In exemplary Embodiment 1, the first resin layer 120 covers at least a part of an outer peripheral surface of each of the first filter 31, the second filter 32, the first matching circuit 51, the second matching circuit 52, the first power amplifier 61, and the second power amplifier 62. More specifically, the first resin layer 120 is provided to cover the first power amplifier 61 and the second power amplifier 62. Further, the first resin layer 120 is provided to cover the electronic components, that is, the first filter 31, the second filter 32, the first matching circuit 51, and the second matching circuit 52. The first resin layer 120 includes a resin (for example, an epoxy resin). The first resin layer 120 may contain a filler in addition to a resin.

In the first resin layer 120, a groove portion 151 is formed between the first power amplifier 61 and the second power amplifier 62, and the first filter 31 and the second filter 32 (see FIGS. 3 and 4). That is, the second power amplifier 62 is disposed on a side of the first power amplifier 61 with respect to the groove portion 151.

The first distance H1, which is from the bottom portion 1511 of the groove portion 151 (see FIGS. 4 and 5) to the main surface (the first main surface 101) on which the first power amplifier 61 is disposed, is shorter than the second distance H2, which is from the upper surface 61*a* of the first power amplifier 61 to the main surface (the first main surface 101) on which the first power amplifier 61 is disposed (see FIG. 4). In other words, when the high frequency module 1 is viewed from the second direction D2, the upper surface 61*a* of the first power amplifier 61 overlaps the groove portion 151. Further, in other words, the groove portion 151 is formed to a position deeper than a position on an extension line of the upper surface 61*a* of the first power amplifier

61. That is, the groove portion 151 includes the bottom portion 1511 positioned between the upper surface 61*a* of the first power amplifier 61 and the first main surface 101 of the mounting board 100 when the mounting board 100 is viewed from a direction (for example, the second direction D2) orthogonal to the thickness direction D1 of the mounting board 100.

More specifically, the first distance H1 is shorter than a third distance H3, which is from a lower surface 61*b* of the first power amplifier 61 to the main surface (the first main surface 101) on which the first power amplifier 61 is disposed (FIG. 4 see). In other words, when the high frequency module 1 is viewed from the second direction D2, the upper surface 61*a* of the first power amplifier 61 and the lower surface 61*b* of the first power amplifier 61 overlap the groove portion 151. Further, in other words, the groove portion 151 is formed to a position deeper than a position on an extension line of the lower surface 61*b* of the first power amplifier 61. That is, the groove portion 151 includes the bottom portion 1511 positioned between the lower surface 61*b* of the first power amplifier 61 and the first main surface 101 of the mounting board 100 when the mounting board 100 is viewed from a direction (for example, the second direction D2) orthogonal to the thickness direction D1 of the mounting board 100.

A distance, which is from the bottom portion 1511 of the groove portion 151 to the main surface (the first main surface 101) on which the second power amplifier 62 is disposed, is shorter than a distance, which is from the upper surface of the second power amplifier to the main surface (the first main surface 101) on which the second power amplifier 62 is disposed. In other words, when the high frequency module 1 is viewed from the second direction D2, the upper surface of the second power amplifier 62 overlaps the groove portion 151. Further, in other words, the groove portion 151 is formed to a position deeper than a position on an extension line of the upper surface of the second power amplifier 62. That is, the groove portion 151 includes the bottom portion 1511 positioned between the upper surface of the second power amplifier 62 and the first main surface 101 of the mounting board 100 when the mounting board 100 is viewed from a direction (for example, the second direction D2) orthogonal to the thickness direction D1 of the mounting board 100.

More specifically, the first distance H1 is shorter than a distance, which is from the lower surface of the second power amplifier 62 to the main surface (the first main surface 101) on which the second power amplifier 62 is disposed. In other words, when the high frequency module 1 is viewed from the second direction D2, the upper surface of the second power amplifier 62 and the lower surface of the second power amplifier 62 overlap the groove portion 151. Further, in other words, the groove portion 151 is formed to a position deeper than a position on an extension line of the lower surface of the second power amplifier 62. That is, the groove portion 151 includes the bottom portion 1511 positioned between the lower surface of the second power amplifier 62 and the first main surface 101 of the mounting board 100 when the mounting board 100 is viewed from a direction (for example, the second direction D2) orthogonal to the thickness direction D1 of the mounting board 100.

A length L1 of the groove portion 151 is longer than a length L2 of the first power amplifier 61 along the third direction D3, which is a direction in which the groove portion 151 extends, in a plan view from the thickness direction D1 of the mounting board 100 (see FIG. 3). The length L1 of the groove portion 151 is longer than a length of the second power amplifier 62 along the third direction D3 in a plan view from the thickness direction D1 of the mounting board 100 (see FIG. 3). Further, the length L1 of the groove portion 151 is longer than a total value of the length L2 of the first power amplifier 61 along the third direction D3 and the length of the second power amplifier 62 along the third direction D3, in a plan view from the thickness direction D1 of the mounting board 100.

Further, the length L1 of the groove portion 151 is longer than a length of the first filter 31 along the third direction D3 in a plan view from the thickness direction D1 of the mounting board 100 (see FIG. 3). The length L1 of the groove portion 151 is longer than a length of the second filter 32 along the third direction D3 in a plan view from the thickness direction D1 of the mounting board 100 (see FIG. 3). Further, the length L1 of the groove portion 151 is longer than a total value of the length of the first filter 31 along the third direction D3 and the length of the second filter 32 along the third direction D3, in a plan view from the thickness direction D1 of the mounting board 100.

In the first resin layer 120, a second groove portion 152, which is different from a first groove portion 151, is provided between the first power amplifier 61 and the second power amplifier 62 as the groove portion 151, in a plan view from the thickness direction D1 of the mounting board 100. One end portion among both end portions of the second groove portion 152 is connected to the first groove portion 151.

In the first resin layer 120, as shown in FIG. 3, a third groove portion 153, a fourth groove portion 154, a fifth groove portion 155, and a sixth groove portion 156, which are different from the first groove portion 151 and the second groove portion 152, are provided. The third groove portion 153 extends in a direction away from the first filter 31, which is the electronic component, from one end portion among both end portions of the first groove portion 151. The fourth groove portion 154 is provided to connect the other end portion among the both end portions of the second groove portion 152 and an end portion of the third groove portion 153. The fifth groove portion 155 extends in a direction away from the second filter 32, which is the electronic component, from the other end portion among the both end portions of the first groove portion 151 (see FIG. 3). The sixth groove portion 156 is provided to connect the other end portion among the both end portions of the second groove portion 152 and an end portion of the fifth groove portion 155.

The first groove portion 151, the second groove portion 152, the third groove portion 153, and the fourth groove portion 154 are formed to surround the first power amplifier 61 in a plan view from the thickness direction D1 of the mounting board 100. The first groove portion 151, the second groove portion 152, the fifth groove portion 155, and the sixth groove portion 156 are formed to surround the second power amplifier 62 in a plan view from the thickness direction D1 of the mounting board 100.

More specifically, in a plan view from the thickness direction D1 of the mounting board 100, the first power amplifier 61 is surrounded by a groove portion 151*a* included in the first groove portion 151, the second groove portion 152, the third groove portion 153, and the fourth groove portion 154. In a plan view from the thickness direction D1 of the mounting board 100, the second power amplifier 62 is surrounded by a groove portion 151*b* included in the first groove portion 151, the second groove portion 152, the fifth groove portion 155, and the sixth groove portion 156.

As shown in FIG. 4, the high frequency module 1 further includes a shield layer 110 and a second resin layer 125. The second resin layer 125 is disposed on a side of the second main surface 102 of the mounting board 100 and covers at least a part of an outer peripheral surface of each of the first switch 20 and the second switch 40 disposed on the second main surface 102 of the mounting board 100. The second resin layer 125 covers a part of the plurality of external connection terminals 200. The second resin layer 125 includes a resin (for example, an epoxy resin). The second resin layer 125 may contain a filler in addition to a resin. A material of the second resin layer 125 may be the same material as the material of the first resin layer 120 or may be a different material. The shield layer 110 is omitted in FIGS. 2 and 3.

The shield layer 110 is provided on a surface of the first resin layer 120 opposite to the mounting board 100 and covers at least a part of the first resin layer 120. In exemplary Embodiment 1, the shield layer 110 covers the upper surface and the outer peripheral surface of the first resin layer 120. Further, the shield layer 110 covers the outer peripheral surface of the mounting board 100 and the outer peripheral surface of the second resin layer 125 (see FIG. 4). A material of the shield layer 110 is, for example, metal. The shield layer 110 is in contact with the ground layer included in the mounting board 100. Accordingly, in the high frequency module 1, a potential of the shield layer 110 can be set to be the same as a potential of the ground layer.

The shield layer 110 includes a power amplifier side shield portion 110*a* and an electronic component side shield portion 110*b*.

Figure 5:
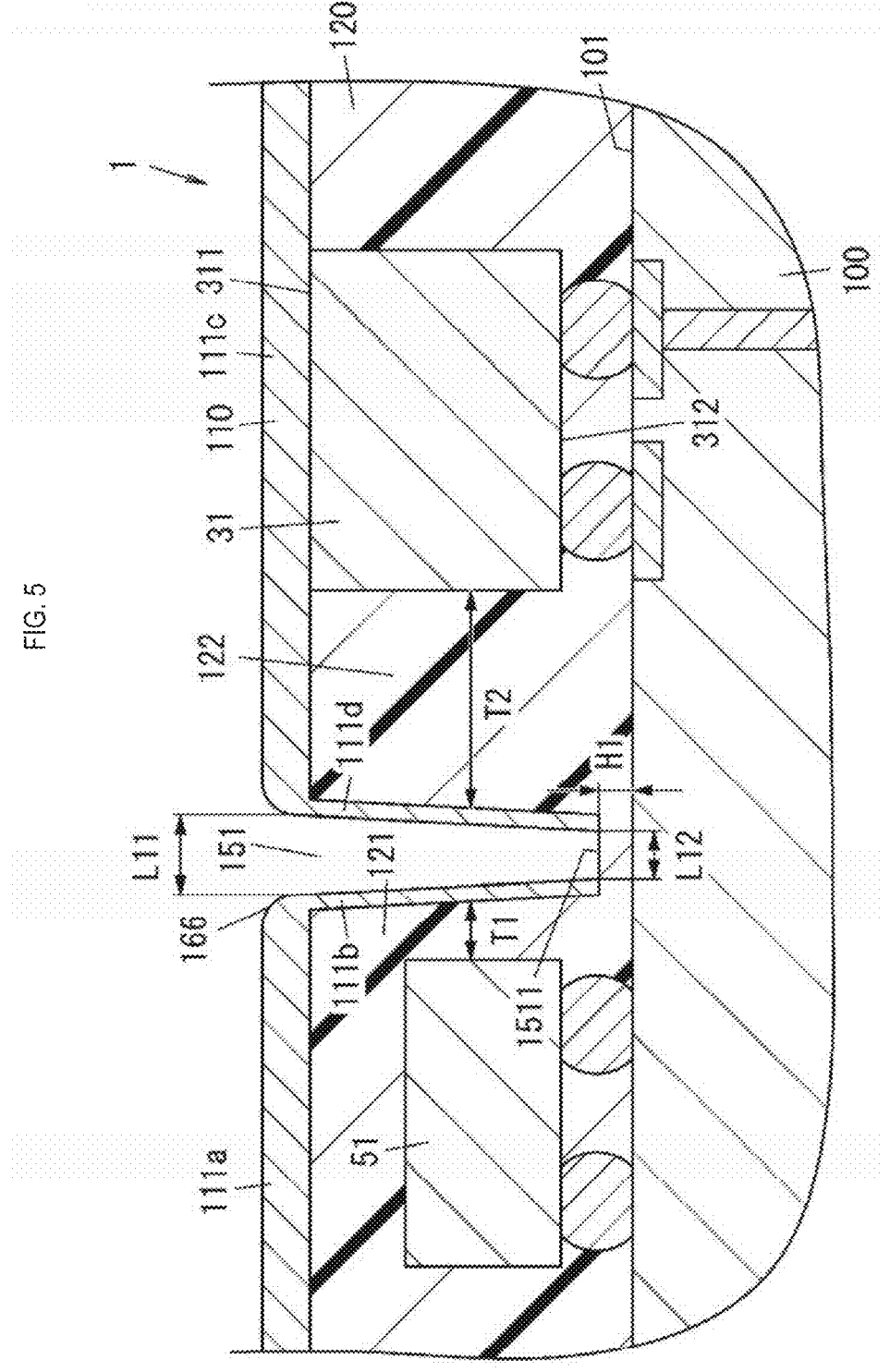
FIG. 5 is an enlarged view of a main portion in FIG. 4.

The power amplifier side shield portion 110*a* covers at least a part of the first resin layer 120. As shown in FIG. 5, the power amplifier side shield portion 110*a* has at least a power amplifier side first shield surface 111*a* and a power amplifier side second shield surface 111*b*.

The power amplifier side first shield surface 111*a* overlaps the first power amplifier 61 in a plan view from the thickness direction D1 of the mounting board 100 (see FIG. 4). The power amplifier side first shield surface 111*a* overlaps the second power amplifier 62 in a plan view from the thickness direction D1 of the mounting board 100. The power amplifier side second shield surface 111*b* covers, among a first side wall 121 (see FIG. 5) and a second side wall (see FIG. 5) of the first resin layer 120 that face each other in the second direction D2, which is a direction in which the first power amplifier 61 and the first filter 31 that is the electronic component are arranged, and that form the groove portion 151, the first side wall 121 that is closer to the first power amplifier 61. For example, the groove portion 151 is formed the first resin layer 120 through laser processing. Thereafter, the power amplifier side second shield surface 111*b* is provided on the first side wall 121 through sputtering or evaporation.

A connection part between the power amplifier side first shield surface 111*a* and the power amplifier side second shield surface 111*b* is formed in an R shape (see FIG. 5).

A thickness T11 of the power amplifier side second shield surface 111*b* is smaller than a thickness T12 of the power amplifier side first shield surface 111*a*. For example, the thickness T12 of the power amplifier side first shield surface 111*a* is 1.5 times or more of the thickness T11 of the power amplifier side second shield surface 111*b*. More preferably, the thickness T12 of the power amplifier side first shield surface 111*a* is two times or more of the thickness T11 of the power amplifier side second shield surface 111*b*. Further, more preferably, the thickness T12 of the power amplifier side first shield surface 111*a* is three times or more of the thickness T11 of the power amplifier side second shield surface 111*b*. Further, the thickness T12 of the power amplifier side first shield surface 111*a* is ten times or less of the thickness T11 of the power amplifier side second shield surface 111*b*.

The electronic component side shield portion 110*b* covers at least a part of the first resin layer 120. As shown in FIG. 5, the electronic component side shield portion 110*b* has at least an electronic component side first shield surface 111*c* and an electronic component side second shield surface 111*d*.

The electronic component side first shield surface 111*c* overlaps the first filter 31 as the electronic component in a plan view from the thickness direction D1 of the mounting board 100 (see FIG. 4). The electronic component side first shield surface 111*c* overlaps the second filter 32 as the electronic component in a plan view from the thickness direction D1 of the mounting board 100. The electronic component side second shield surface 111*d* covers, among the first side wall 121 and the second side wall of the first resin layer 120 that face each other in the second direction D2, which is a direction in which the first power amplifier 61 and the first filter 31 as the electronic component are arranged, and that form the groove portion 151, the second side wall 122 that is closer to the first filter 31 as the electronic component. For example, the electronic component side second shield surface 111*d* is provided on the second side wall 122, which is formed with respect to the first resin layer 120 through laser processing, through sputtering or evaporation.

A connection part between the electronic component side first shield surface 111*c* and the electronic component side second shield surface 111*d* is formed in an R shape. At least a part of each of the first filter 31 and the second filter 32 as the electronic component is in contact with the electronic component side shield portion 110*b*. Specifically, among an upper surface 311 and a lower surface 312 of the first filter 31 that are opposite to each other in the thickness direction D1 of the mounting board 100, the upper surface 311 is in contact with the electronic component side shield portion 110*b* (the electronic component side first shield surface 111*c*). Similarly, among an upper surface and a lower surface of the second filter 32 that are opposite to each other in the thickness direction D1 of the mounting board 100, the upper surface is in contact with the electronic component side shield portion 110*b* (the electronic component side first shield surface 111*c*).

As described above, the power amplifier side second shield surface 111*b* covers the first side wall 121 and the electronic component side second shield surface 111*d* covers the second side wall 122, respectively. That is, the groove portion 151 is provided between the power amplifier side second shield surface 111*b* and the electronic component side second shield surface 111*d*. A diameter L12 of the bottom portion 1511 of the groove portion 151 formed in this way is smaller than a diameter L11 of an opening surface of the groove portion 151 (see FIG. 5). That is, the groove portion 151 is formed in a substantially V shape. For example, a diameter L11 of the opening surface of the groove portion 151 is 1.5 times or more and 3 times or less of the diameter L12 of the bottom portion 1511 of the groove portion 151.

A thickness T1 of the first side wall 121, which is covered by the power amplifier side second shield surface 111*b*, is smaller than a thickness T2 of the second side wall 122, which is covered by the electronic component side second shield surface 111*d* (see FIG. 5). For example, the thickness T2 of the second side wall 122 is 1.5 times or more and 3 times or less of the thickness T1 of the first side wall 121. The thickness T1 of the first side wall 121 is a distance from a surface of the first side wall 121 to the closest electronic component (here, the first matching circuit 51). The thickness T2 of the second side wall 122 is a distance from a surface of the second side wall 122 to the closest electronic component (here, the first filter 31). As described above, since the groove portion 151 is formed in a substantially V shape, the thickness of each of the first side wall 121 and the second side wall 122 increases toward the mounting board 100 along the thickness direction D1 of the mounting board 100. Here, the thickness T1 of the first side wall 121 is an average value of the thickness of the first side wall 121, and the thickness T2 of the second side wall 122 is an average value of the thickness of the second side wall 122. The thickness T1 of the first side wall 121 may be the maximum value or the minimum value of the thickness of the first side wall 121. Similarly, the thickness T2 of the second side wall 122 may be the maximum value or the minimum value of the thickness of the second side wall 122.

The second groove portion 152, the third groove portion 153, the fourth groove portion 154, the fifth groove portion 155, and the sixth groove portion 156 have the same shape as that of the groove portion 151 (the first groove portion 151). That is, each of the second groove portion 152, the third groove portion 153, the fourth groove portion 154, the fifth groove portion 155, and the sixth groove portion 156 is formed to have a substantially V shape. In each of the second groove portion 152, the third groove portion 153, the fourth groove portion 154, the fifth groove portion 155, and the sixth groove portion 156 formed in a substantially V shape, the side walls facing each other, are covered with the shield surface. A thickness of the shield surface that covers the side walls facing each other is smaller than the thickness of the power amplifier side first shield surface 111*a* and the thickness of the electronic component side first shield surface 111*c*. A connection part between the shield surface that covers the side walls facing each other and the power amplifier side first shield surface 111*a* or the electronic component side first shield surface 111*c* is formed in an R shape.

As described above, the mounting board 100 includes the plurality of ground terminals 210 to 212 that are connected to the ground. Hereinafter, the ground terminal 211 is referred to as a first ground terminal 211 and the ground terminal 212 is referred to as a second ground terminal 212. That is, the mounting board 100 includes the first ground terminal 211 and the second ground terminal 212 that are connected to the ground. The first ground terminal 211 is connected to the first power amplifier 61. A first path P1, which connects the first ground terminal 211 and the first power amplifier 61, does not overlap the groove portion 151 in a plan view from the thickness direction D1 of the mounting board 100 (see FIG. 4). Here, the first path P1 is formed of a via conductor and a conductor pattern. Although not shown, the first path P1 also does not overlap the second groove portions 152, the third groove portions 153, and the fourth groove portions 154 in a plan view from the thickness direction D1 of the mounting board 100. Further, a path between the first power amplifier 61 and the ground terminal 210 connected to the first power amplifier 61 does not overlap the groove portion 151 (the first groove portion 151), the second groove portion 152, the third groove portion 153, and the fourth groove portion 154 in a plan view from the thickness direction D1 of the mounting board 100.

The second ground terminal 212 is connected to the first filter 31, which is the electronic component. A second path P2, which connects the second ground terminal 212 and the first filter 31 that is the electronic component, does not overlap the groove portion 151 in a plan view from the thickness direction D1 of the mounting board 100 (see FIG. 4). Here, the second path P2 is formed of a via conductor and a conductor pattern.

Similarly, a third path between the second power amplifier 62 and the ground terminal connected to the second power amplifier 62 does not overlap the groove portion 151 in a plan view from the thickness direction D1 of the mounting board 100. Here, the third path is formed of a via conductor and a conductor pattern. Further, although not shown, the third path does not overlap the second groove portion 152, the fifth groove portion 155, and the sixth groove portion 156 in a plan view from the thickness direction D1 of the mounting board 100.

Further, a fourth path between the second filter 32 and the ground terminal connected to the second filter 32 does not overlap the groove portion 151 in a plan view from the thickness direction D1 of the mounting board 100. Here, the fourth path is formed of a via conductor and a conductor pattern.

(3) Effects

As described above, the high frequency module 1 according to exemplary Embodiment 1 includes the mounting board 100, the power amplifier (the first power amplifier 61 and the second power amplifier 62), the electronic component (for example, the first filter 31 and the second filter 32), and the resin layer (for example, the first resin layer 120). The mounting board 100 has the first main surface 101 and the second main surface 102 that are opposite to each other. The power amplifier is disposed on a main surface of either the first main surface 101 or the second main surface 102 of the mounting board 100. The electronic component is disposed on the main surface of the mounting board 100 on which the power amplifier is disposed. The resin layer is disposed at least between the power amplifier and the electronic component in a plan view from the thickness direction D1 of the mounting board 100. The power amplifier has a third main surface (for example, an upper surface 61a) and a fourth main surface (for example, a lower surface 61b) that are opposite to each other in the thickness direction D1 of the mounting board 100. The fourth main surface of the power amplifier is provided between the third main surface of the power amplifier and the main surface of the mounting board 100 on which the power amplifier is disposed. The groove portion 151 is formed at least between the power amplifier and the electronic component in the resin layer. The groove portion 151 includes the bottom portion 1511 positioned between the third main surface of the power amplifier and the first main surface 101 of the mounting board 100 when the mounting board 100 is viewed from a direction (for example, the second direction D2) orthogonal to the thickness direction D1 of the mounting board 100.

According to the configuration, the groove portion 151 includes the bottom portion 1511 positioned between the third main surface of the power amplifier and the first main surface 101 of the mounting board 100 when the mounting board 100 is viewed from the second direction D2. When the mounting board 100 is viewed from the second direction D2, since the bottom portion 1511 of the groove portion 151 is positioned between the third main surface of the power amplifier and the first main surface 101 of the mounting board 100, the possibility that heat generated by the power amplifier is transferred to the electronic component between the surface of the resin layer and the power amplifier is reduced. Therefore, the heat insulation between the power amplifier and the electronic component can be further improved.

(4) Modification Example

Here, modification examples according to exemplary Embodiment 1 will be described.

(4.1) Modification Example 1

In exemplary Embodiment 1, although the power amplifiers (the first power amplifier 61 and the second power amplifier 62) are flip-chip mounted, the present disclosure is not limited to this configuration. The power amplifier may be connected to the mounting board 100 through a wire.

Figure 6:
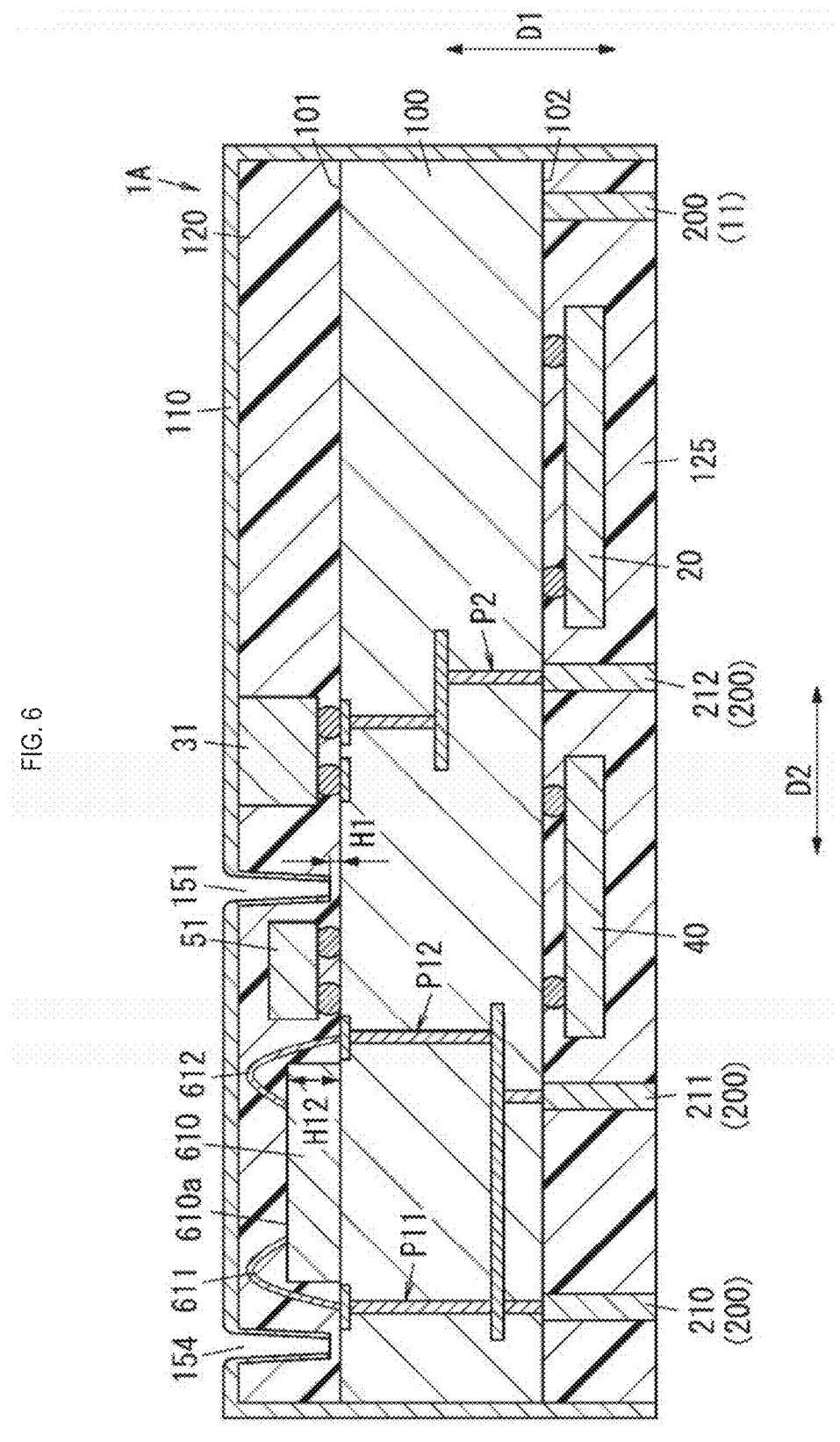
FIG. 6 is a cross-sectional view of a high frequency module according to Modification Example 1.

A high frequency module 1A according to Modification Example 1 includes a first power amplifier 610 instead of the first power amplifier 61 (see FIG. 6).

Among an upper surface 610a and a lower surface of the first power amplifier 610 opposite to each other in the thickness direction D1 of the mounting board 100, the upper surface 610a and the first main surface 101 of the mounting board 100 are connected through wire-bonding by using one or a plurality of (two in the illustrated example) wires 611 and 612.

In the high frequency module 1A of Modification Example 1, the first distance H1, which is from the bottom portion 1511 of the groove portion 151 to the main surface (the first main surface 101) on which the first power amplifier 61 is disposed, is shorter than a second distance H12, which is from the upper surface 610a of the first power amplifier 610 to the main surface (the first main surface 101) on which the first power amplifier 610 is disposed (see FIG. 6).

The ground terminal 210 included in the high frequency module 1A of Modification Example 1 is connected to the wire 611 with a path P11 interposed therebetween. The ground terminal 211 included in the high frequency module 1A of Modification Example 1 is connected to the wire 612 with a path P12 interposed therebetween. Each of the path P11 and the path P12 does not overlap the groove portion 151 in a plan view from the thickness direction D1 of the mounting board 100 (see FIG. 6). Here, each of the paths P11 and P12 is formed of a via conductor and a conductor pattern. Although not shown, each of the paths P11 and P12 also does not overlap the second groove portions 152, the third groove portions 153, and the fourth groove portions 154 in a plan view from the thickness direction D1 of the mounting board 100.

Similarly, a power amplifier (hereinafter referred to as a third power amplifier), which is connected to the mounting board 100 through wire-bonding by using one or a plurality of wires, may be used instead of the second power amplifier 62. In this case, the first distance H1 is also shorter than a distance from an upper surface of the third power amplifier to the main surface (the first main surface 101) on which the third power amplifier is disposed. Further, a path (hereinafter, a fifth path) between the third power amplifier and the ground terminal, which is connected to the second power amplifier 62 with a wire interposed therebetween, does not overlap the groove portion 151 in a plan view from the thickness direction D1 of the mounting board 100. Here, the fifth path is formed of a via conductor and a conductor pattern. Further, although not shown, the fifth path does not overlap the second groove portion 152, the fifth groove portion 155, and the sixth groove portion 156 in a plan view from the thickness direction D1 of the mounting board 100.

In Modification Example 1, when the mounting board 100 is viewed from the second direction D2, since the bottom portion 1511 of the groove portion 151 is positioned between the third main surface of the power amplifier and the first main surface 101 of the mounting board 100, the heat insulation between the power amplifier and the electronic component can be further improved.

(4.2) Modification Example 2

Figure 7:
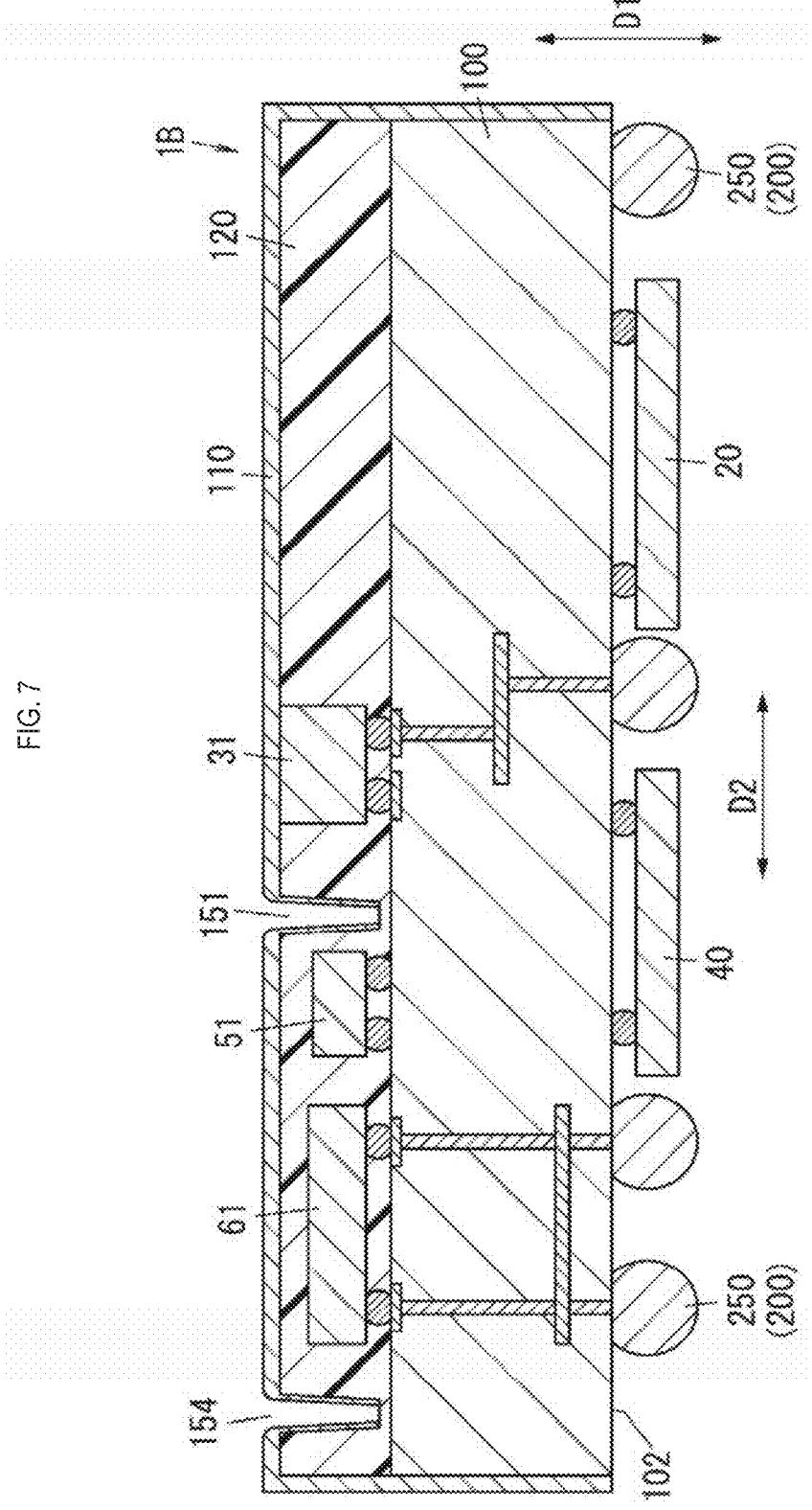
FIG. 7 is a cross-sectional view of a high frequency module according to Modification Example 2.

A high frequency module 1B according to Modification Example 2 will be described with reference to FIG. 7. Regarding the high frequency module 1B according to Modification Example 2, configuration elements similar to those of the high frequency module 1 are given the same reference numerals, and description thereof will be omitted as appropriate.

The high frequency module 1B according to Modification Example 2 is different from the high frequency module 1 in a fact that external connection terminals 200 as a plurality of external connection terminals 200 are ball bumps 250. Further, the high frequency module 1B according to Modification Example 2 is different from the high frequency module 1 in a fact that the high frequency module 1B does not include the second resin layer 125 of the high frequency module 1. The high frequency module 1B according to Modification Example 2 may include an underfill portion provided in a gap between the first switch 20 and the second switch 40, and the second main surface 102 of the mounting board 100.

A material of the ball bump 250 that configures each of the plurality of external connection terminals 200 is, for example, gold, copper, solder, or the like.

The plurality of external connection terminals 200 may include both the external connection terminals 200 configured with the ball bumps 250 and the external connection terminals 200 formed in a prismatic shape.

In Modification Example 2, when the mounting board 100 is viewed from the second direction D2, since the bottom portion 1511 of the groove portion 151 is positioned between the third main surface of the power amplifier and the first main surface 101 of the mounting board 100, the heat insulation between the power amplifier and the electronic component can be further improved.

(4.3) Modification Example 3

Figure 8:
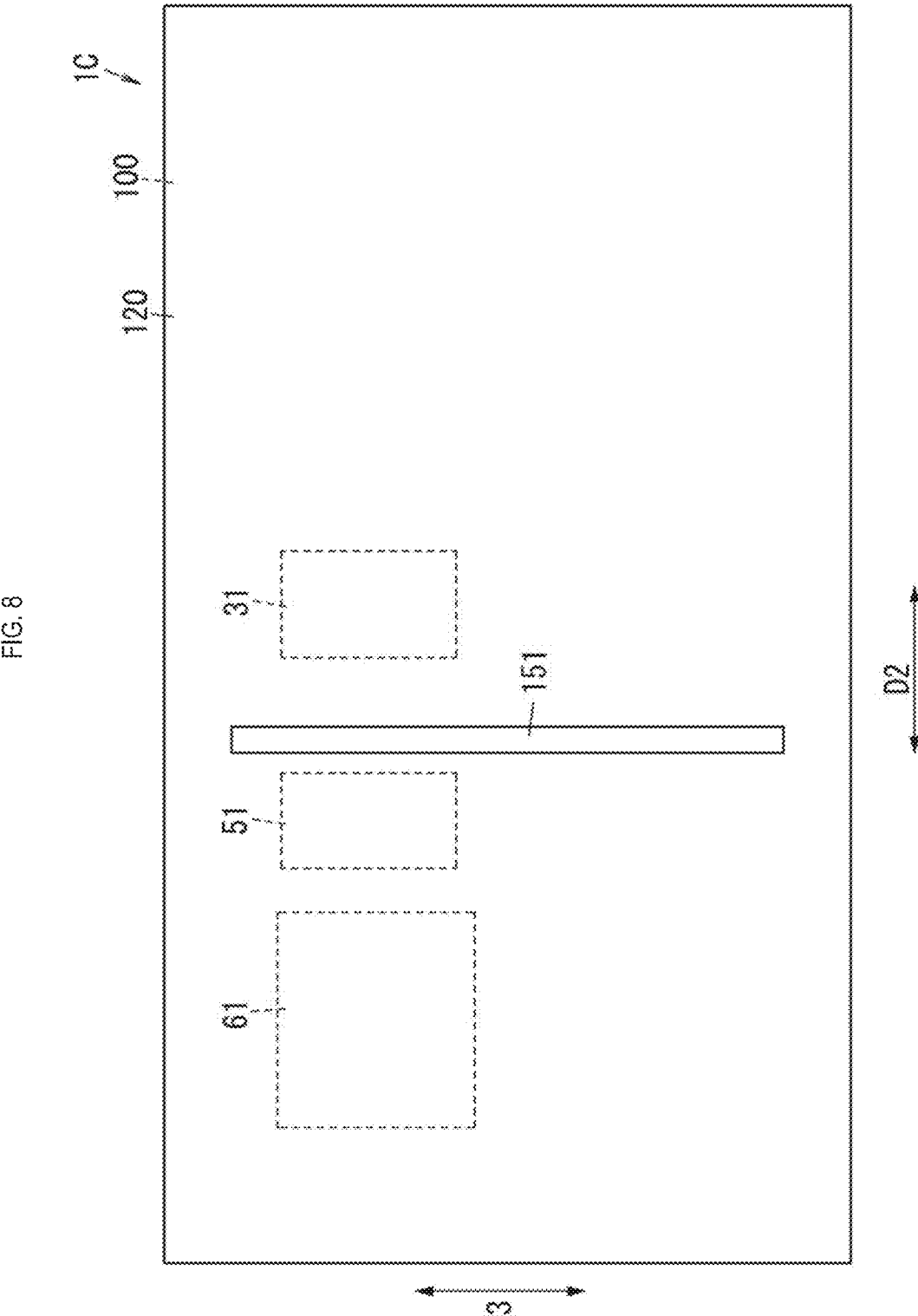
FIG. 8 is a plan view showing a disposition of the groove portion on the first main surface of the mounting board included in a high frequency module according to Modification Example 3.

A high frequency module 1C according to Modification Example 3 will be described with reference to FIG. 8. Regarding the high frequency module 1C according to Modification Example 3, configuration elements similar to those of the high frequency module 1 are given the same reference numerals, and description thereof will be omitted as appropriate.

The high frequency module 1C according to Modification Example 3 is different from the high frequency module 1 in a fact that the number of disposed power amplifiers is one. That is, the high frequency module 1C according to Modification Example 3 includes the first power amplifier 61 (hereinafter, simply referred to as a "power amplifier 61") that is disposed on a main surface (here, the first main surface 101) of either the first main surface 101 or the second main surface 102 of the mounting board 100. The high frequency module 1C includes the first resin layer 120 (hereinafter, also simply referred to as a "resin layer 120") that is disposed at least between the power amplifier 61 and the first filter 31, which is the electronic component, in a plan view from the thickness direction D1 (see FIG. 4) of the mounting board 100. In the high frequency module 1C according to Modification Example 3, in the resin layer 120, the groove portion 151 is formed between the power amplifier 61 and the first filter 31 (see FIG. 8). The shield layer 110 is omitted in FIG. 8.

Figure 9:
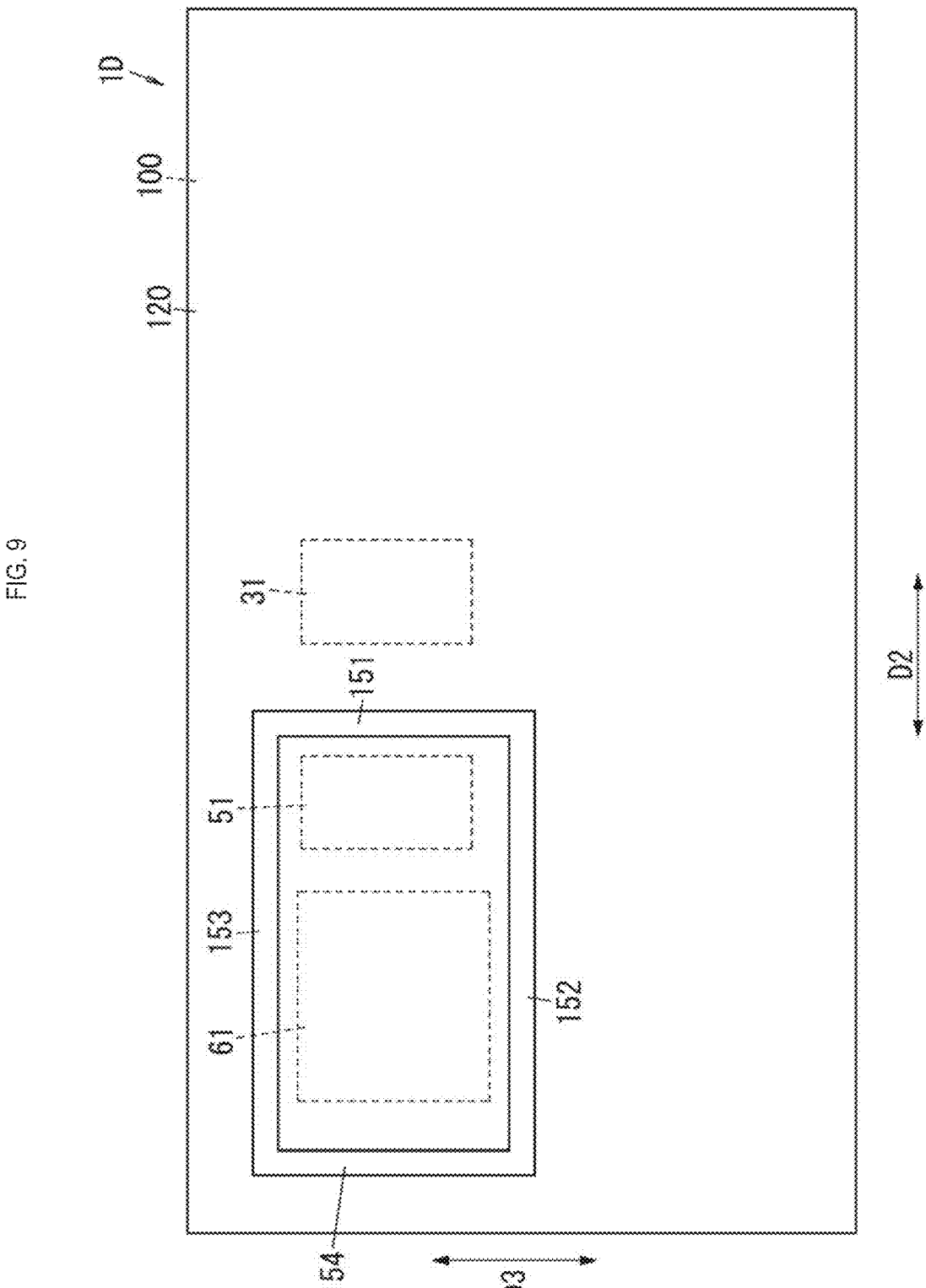
FIG. 9 is a plan view showing a disposition of the groove portion on the first main surface of the mounting board included in a high frequency module according to another Modification Example of Modification Example 3.

Alternatively, in a high frequency module 1D according to another modification example of Modification Example 3, four groove portions may be formed to surround the power amplifier 61 (see FIG. 9). In this case, the resin layer 120 is provided to cover the power amplifier 61. In the resin layer 120, the second groove portion 152, the third groove portion 153, and the fourth groove portion 154, which are different from the first groove portion 151, are provided as the groove portion 151. The second groove portion 152 according to Modification Example 3 extends in a direction away from the first filter 31, which is the electronic component, from one end portion among the both end portions of the first groove portion 151. The third groove portion 153 according to Modification Example 3 extends in a direction away from the first filter 31, which is the electronic component, from the other end portion among the both end portions of the first groove portion 151. The fourth groove portion 154 according to Modification Example 3 is provided to connect the end portion of the second groove portion 152 and the end portion of the third groove portion 153. The first groove portion 151, the second groove portion 152, the third groove portion 153, and the fourth groove portion 154 are formed to surround the power amplifier 61 in a plan view from the thickness direction D1 of the mounting board 100. The shield layer 110 is omitted in FIG. 9.

In Modification Example 3, when the mounting board 100 is viewed from the second direction D2, since the bottom portion 1511 of the groove portion 151 is positioned between the third main surface of the power amplifier and the first main surface 101 of the mounting board 100, the heat insulation between the power amplifier and the electronic component can be further improved.

(4.4) Modification Example 4

The groove portion 151 may be provided between the first power amplifier 61 and the first matching circuit 51 and between the second power amplifier 62 and the second matching circuit 52. In this case, the thickness T1 of the first side wall 121 is a distance from the surface of the first side wall 121 to the first power amplifier 61.

In Modification Example 4, when the mounting board 100 is viewed from the second direction D2, since the bottom portion 1511 of the groove portion 151 is positioned between the third main surface of the power amplifier and the first main surface 101 of the mounting board 100, the heat insulation between the power amplifier and the electronic component can be further improved.

(4.5) Modification Example 5

The first power amplifier 61, the second power amplifier 62, the first filter 31, and the second filter 32 may be provided on the second main surface 102 of the mounting board 100. In this case, the groove portion 151 is formed between the first power amplifier 61 and the first matching circuit 51 and between the second power amplifier 62 and the second matching circuit 52 in the second resin layer 125. Further, the second groove portion 152, the third groove portion 153, the fourth groove portion 154, the fifth groove portion 155, and the sixth groove portion 156 are also provided in the second resin layer 125. At this time, the groove portion 151 (the first groove portion), the second groove portion 152, the third groove portion 153, and the fourth groove portion 154 are provided in the second resin layer 125 to surround the first power amplifier 61. The groove portion 151 (the first groove portion), the second groove portion 152, the fifth groove portion 155, and the sixth groove portion 156 are provided in the second resin layer 125 to surround the second power amplifier 62.

In Modification Example 5, when the mounting board 100 is viewed from the second direction D2, since the bottom portion 1511 of the groove portion 151 is positioned between the third main surface of the power amplifier and the first main surface 101 of the mounting board 100, the heat insulation between the power amplifier and the electronic component can be further improved.

(4.6) Modification Example 6

In exemplary Embodiment 1, although one groove portion 151 is formed between the first power amplifier 61 and the second power amplifier 62, and the first filter 31 and the second filter 32, the present disclosure is not limited to this configuration. A plurality of groove portions may be formed to be arranged along the third direction D3 between the first power amplifier 61 and the second power amplifier 62, and the first filter 31 and the second filter 32.

Further, a plurality of groove portions may be formed to be arranged along the second direction D2 between the first power amplifier 61 and the second power amplifier 62, instead of the second groove portion 152. A plurality of groove portions may be formed to be arranged along the second direction D2 instead of the third groove portion 153. A plurality of groove portions may be formed to be arranged along the third direction D3 instead of the fourth groove portion 154. A plurality of groove portions may be formed to be arranged along the second direction D2 instead of the fifth groove portion 155. Further, a plurality of groove portions may be formed to be arranged along the third direction D3 instead of the sixth groove portion 156. That is, each of the first power amplifier 61 and the second power amplifier 62 may be surrounded by a plurality of groove portions.

In Modification Example 6, when the mounting board 100 is viewed from the second direction D2, since the bottom portions of a plurality of groove portions are positioned between the third main surface of the power amplifier and the first main surface 101 of the mounting board 100, the heat insulation between the power amplifier and the electronic component can be further improved.

Embodiment 2

A high frequency module 1E according to exemplary Embodiment 2 will be described with reference to FIGS. 10 and 11. Regarding the high frequency module 1E according to exemplary Embodiment 2, configuration elements similar to those of the high frequency module 1 are given the same reference numerals, and description thereof will be omitted as appropriate.

The high frequency module 1E according to exemplary Embodiment 2 is different from the high frequency module 1 in a fact that the high frequency module 1E receives a high frequency signal (a reception signal) from the outside. A communication device 500E according to exemplary Embodiment 2 includes the high frequency module 1E, the signal processing circuit 501, the first antenna 511, and the second antenna 512.

Each of the first antenna 511 according to exemplary Embodiment 2 and the second antenna 512 according to exemplary Embodiment 2 has a reception function of receiving reception signals as radio waves from the outside and outputting the signals to the high frequency module 1E, in addition to the above-described transmission function.

The signal processing circuit 501 includes the RF signal processing circuit 502 and the baseband signal processing circuit 503.

The RF signal processing circuit 502 according to exemplary Embodiment 2 performs signal processing such as up-conversion on the transmission signal and outputs the high frequency signal on which the signal processing is performed. Further, for example, the RF signal processing circuit 502 according to exemplary Embodiment 2 performs the signal processing such as down-conversion on the high frequency signal (the reception signal) that is output from the high frequency module 1 and outputs the high frequency signal on which the signal processing has been performed to the baseband signal processing circuit 503. The reception signal, which is processed by the baseband signal processing circuit 503 according to exemplary Embodiment 2, is used, for example, as an image signal for displaying an image, or as an audio signal for making a phone call. The high frequency module 1E according to exemplary Embodiment 2 transfers a high frequency signal (a transmission signal, a reception signal) between the first antenna 511 and the second antenna 512, and the RF signal processing circuit 502 of the signal processing circuit 501.

Figure 10:
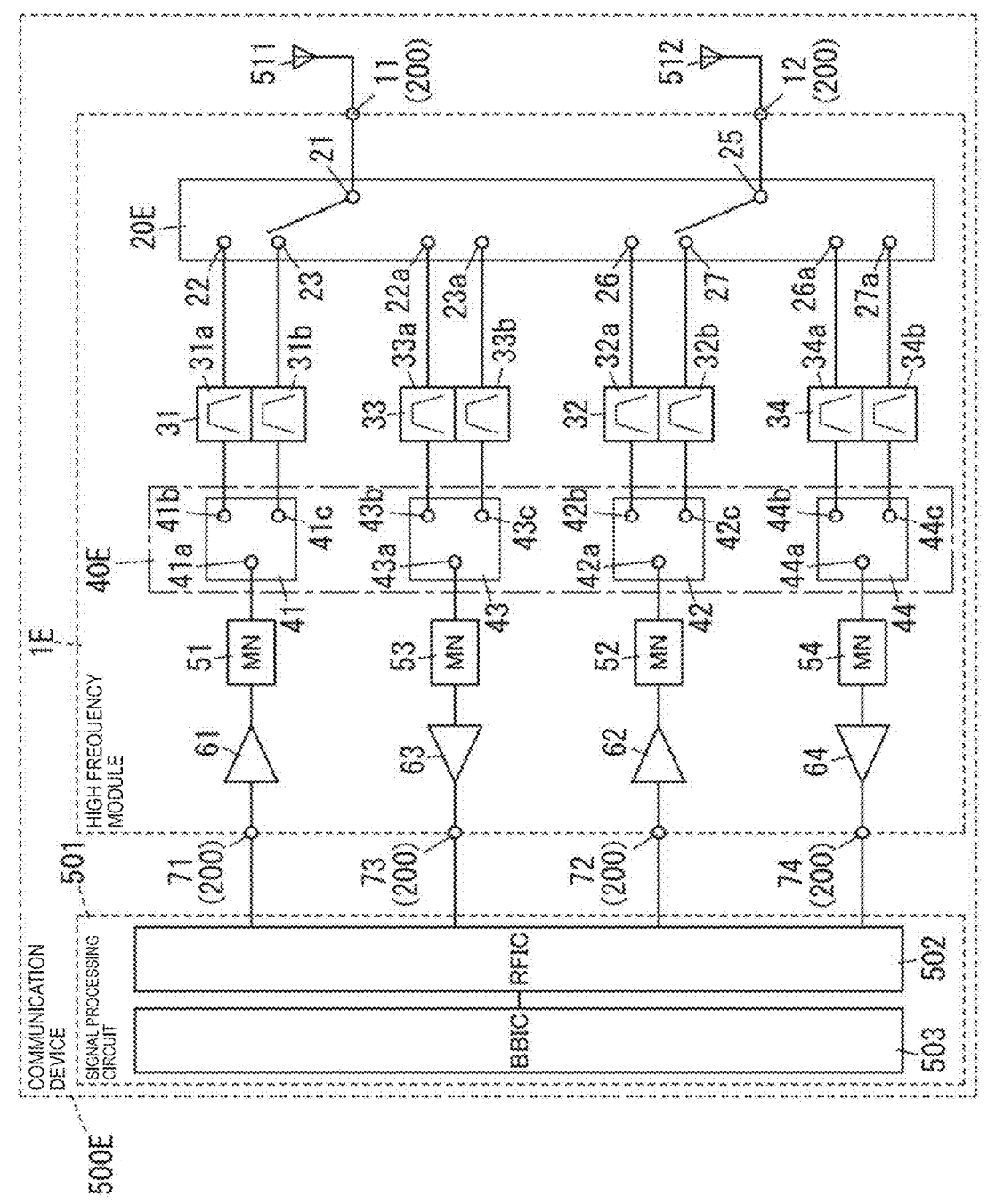
FIG. 10 is a circuit view explaining a configuration of a communication device including a high frequency module according to exemplary Embodiment 2.

As shown in FIG. 10, the high frequency module 1E according to exemplary Embodiment 2 includes a plurality of (two in the illustrated example) antenna terminals (a first antenna terminal 11 and a second antenna terminal 12), a first switch 20E, a first filter 31, a second filter 32, a third filter 33, a fourth filter 34, and a second switch 40E. Further, as shown in FIG. 10, the high frequency module 1E according to exemplary Embodiment 2 includes a first matching circuit 51, a second matching circuit 52, a third matching circuit 53, a fourth matching circuit 54, and a first power amplifier 61, a second power amplifier 62, a first low noise amplifier 63, and a second low noise amplifier 64. The high frequency module 1 includes one or a plurality of (two in the illustrated example) signal input terminals 71 and 72 and one or a plurality of (two in the illustrated example) signal output terminals 73 and 74.

The first switch 20E is a switch IC configured with one chip. The first switch 20E is configured such that the first filter 31 and the third filter 33 are connectable to the first antenna 511. The first switch 20E is configured such that the second filter 32 and the fourth filter 34 are connectable to the second antenna 512. The first switch 20E is configured such that the first filter 31 and the second filter 32 are connectable to the first antenna 511 and the second antenna 512 at the same time. The first switch 20E is configured such that the third filter 33 and the fourth filter 34 are connectable to the first antenna 511 and the second antenna 512 at the same time. That is, the first switch 20E is a switch IC that includes a switch that enables the first filter 31 and the second filter 32 to be connectable to the first antenna 511 and the second antenna 512 and that enables the third filter 33 and the fourth filter 34 to be connectable to the first antenna 511 and the second antenna 512.

The first switch 20E includes a plurality of (two in the illustrated example) reception side first selection terminals 22a and 23a and a plurality of (two in the illustrated example) reception side second selection terminals 26a and 27a, in addition to the above-described configuration elements. Under the control of the signal processing circuit 501, the first switch 20E selects at least one terminal among the first selection terminal 22, the first selection terminal 23, the reception side first selection terminal 22a, and the reception side first selection terminal 23a, as a connection destination of the first common terminal 21. Under the control of the signal processing circuit 501, the first switch 20E selects at least one terminal among the second selection terminal 26, the second selection terminal 27, the reception side second selection terminal 26a, and the reception side second selection terminal 27a, as a connection destination of the second common terminal 25.

The reception side first selection terminals 22a and 23a are electrically connected to the third filter 33. Specifically, the reception side first selection terminal 22a is electrically connected to a first reception filter 33a, which will be described later, included in the third filter 33. The reception side first selection terminal 23a is electrically connected to a second reception filter 33b, which will be described later, included in the third filter 33.

The reception side second selection terminals 26a and 27a are electrically connected to the fourth filter 34. Specifically, the reception side second selection terminal 26a is electrically connected to a third reception filter 34a, which will be described later, included in the fourth filter 34. The reception side second selection terminal 27a is electrically connected to a fourth reception filter 34b, which will be described later, included in the fourth filter 34.

The third filter 33 includes the first reception filter 33a and the second reception filter 33b.

The first reception filter 33a is a reception filter that passes a reception signal (a first reception signal) in a predetermined frequency band received by the first antenna 511. The first reception filter 33a passes, for example, the first reception signal in a reception band (2110 MHz to 2170 MHz) of Band 1, which is a mid-band frequency band defined in 4G. The first reception filter 33a is electrically connected to the reception side first selection terminal 22a of the first switch 20E and passes the first reception signal. The first reception filter 33a is, for example, a ladder filter and includes a plurality of (for example, four) series arm resonators and a plurality of (for example, three) parallel arm resonators. The first reception filter 33a is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, an SAW resonator. The first reception filter 33a is not limited to an SAW filter. The first reception filter 33a may be, for example, a BAW filter other than an SAW filter.

The second reception filter 33b is a reception filter that passes a reception signal (a second reception signal) in a predetermined frequency band received by the first antenna 511. The second transmission filter 31b passes, for example, the second reception signal in a reception band (1930 MHz to 1990 MHz) of Band 3 defined in the 4G standard. The second reception filter 33b is electrically connected to the reception side first selection terminal 23a of the first switch 20E and passes the second reception signal. The second reception filter 33b is, for example, a ladder filter and includes a plurality of (for example, four) series arm resonators and a plurality of (for example, three) parallel arm resonators. The second reception filter 33b is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, an SAW resonator. The second reception filter 33b is not limited to an SAW filter. The second reception filter 33b may be, for example, a BAW filter other than an SAW filter.

The fourth filter 34 includes the third reception filter 34a and the fourth reception filter 34b.

The third reception filter 34a is a transmission filter that passes a reception signal (a third transmission signal) in a predetermined frequency band received by the second antenna 512. The third transmission filter 32a passes, for example, the third reception signal of n41 (a frequency band 2496 to 2690 MHz) which is a high-band frequency band standardized in 5G. The third reception filter 34a is electrically connected to the reception side second selection terminal 26a of the first switch 20E and passes the third reception signal. The third reception filter 34a is, for example, a ladder filter and includes a plurality of (for example, four) series arm resonators and a plurality of (for example, three) parallel arm resonators. The third reception filter 34a is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, an SAW resonator. The third reception filter 34a is not limited to an SAW filter. The third reception filter 34a may be, for example, a BAW filter other than an SAW filter.

The fourth reception filter 34b is a transmission filter that passes a reception signal (a fourth reception signal) in a predetermined frequency band received by the second antenna 512. The fourth reception filter 34b passes, for example, the fourth reception signal of n41 (a frequency band 2300 to 2400 MHz) which is a high-band frequency band standardized by 5G. The fourth reception filter 34b is electrically connected to the reception side second selection terminal 27a of the first switch 20E and passes the fourth reception signal. The fourth reception filter 34b is, for example, a ladder filter and includes a plurality of (for example, four) series arm resonators and a plurality of (for example, three) parallel arm resonators. The fourth reception filter 34b is, for example, an acoustic wave filter. Regarding the acoustic wave filter, each of the plurality of series arm resonators and the plurality of parallel arm resonators is configured with an acoustic wave resonator. The acoustic wave filter is, for example, a surface acoustic wave filter that utilizes surface acoustic waves. In the surface acoustic wave filter, each of the plurality of series arm resonators and the plurality of parallel arm resonators is, for example, an SAW resonator. The fourth reception filter 34b is not limited to an SAW filter. The fourth reception filter 34b may be, for example, a BAW filter other than an SAW filter.

The second switch 40E is configured with one chip. As shown in FIG. 10, the second switch 40 includes a third switch 41, a fourth switch 42, a fifth switch 43, and a sixth switch 44. The fifth switch 43 switches a filter connected to the first low noise amplifier 63. The sixth switch 44 switches a filter connected to the second low noise amplifier 64.

The fifth switch 43 includes a fifth common terminal 43a, and a plurality of (two in the illustrated example) fifth selection terminals 43b and 43c. The fifth switch 43 selects at least one of a plurality of fifth selection terminals 43b and 43c as a connection destination of the fifth common terminal 43a, under the control of the signal processing circuit 501. The fifth common terminal 43a is electrically connected to the first low noise amplifier 63. The plurality of fifth selection terminals 43b and 43c are electrically connected to the first antenna terminal 11 with the first switch 20E interposed therebetween. That is, the plurality of fifth selection terminals 43b and 43c are electrically connected to the first antenna 511 with the first antenna terminal 11 interposed therebetween. Specifically, the fifth selection terminal 43b is electrically connected to the first reception filter 33a of the third filter 33. The fifth selection terminal 43b is electrically connected to the first antenna 511 with the first reception filter 33a interposed therebetween. The fifth selection terminal 43c is electrically connected to the second reception filter 33b of the third filter 33, and the fifth selection terminal 43c is electrically connected to the first antenna 511 with the second reception filter 33b interposed therebetween.

The sixth switch 44 includes a sixth common terminal 44a, and a plurality of (two in the illustrated example) sixth selection terminals 44b and 44c. The sixth switch 44 selects at least one of a plurality of sixth selection terminals 44b and 44c as a connection destination of the sixth common terminal 44a, under the control of the signal processing circuit 501. The sixth common terminal 44a is electrically connected to the second low noise amplifier 64. The plurality of sixth selection terminals 44b and 44c are electrically connected to the second antenna terminal 12 with the first switch 20E interposed therebetween. That is, the plurality of sixth selection terminals 44b and 44c are electrically connected to the second antenna 512 with the second antenna terminal 12 interposed therebetween. Specifically, the sixth selection terminal 44b is electrically connected to the third reception filter 34a of the fourth filter 34. The sixth selection terminal 44b is electrically connected to the second antenna 512 with the third reception filter 34a interposed therebetween. The sixth selection terminal 44c is electrically connected to the fourth reception filter 34b of the fourth filter 34, and the sixth selection terminal 44c is electrically connected to the second antenna 512 with the fourth reception filter 34b interposed therebetween.

The third matching circuit 53 is electrically connected in a path between the fifth switch 43 included in the second switch 40E and the first low noise amplifier 63 and performs impedance matching between the fifth switch 43 and the first low noise amplifier 63. The fourth matching circuit 54 is electrically connected in a path between the sixth switch 44 included in the second switch 40E and the second low noise amplifier 64 and performs impedance matching between the sixth switch 44 and the second low noise amplifier 64.

The first low noise amplifier 63 is an amplifier that amplifies the reception-transmission signals (the first reception signal and the second reception signal) received by the first antenna 511. An input terminal of the first low noise amplifier 63 is electrically connected to the third matching circuit 53. An output terminal of the first low noise amplifier 63 is electrically connected to the signal output terminal 73. That is, the first low noise amplifier 63 is electrically connected to the third filter 33 with the third matching circuit 53 interposed therebetween. That is, the first low noise amplifier 63 is electrically connected to the first switch 20E with the third filter 33 interposed therebetween.

The second low noise amplifier 64 is an amplifier that amplifies the reception-transmission signals (the third reception signal and the fourth reception signal) received by the second antenna 512. An input terminal of the second low noise amplifier 64 is electrically connected to the fourth matching circuit 54. An output terminal of the second low noise amplifier 64 is electrically connected to the signal output terminal 74. That is, the second low noise amplifier 64 is electrically connected to the fourth filter 34 with the fourth matching circuit 54 interposed therebetween. That is, the second low noise amplifier 64 is electrically connected to the first switch 20E with the fourth filter 34 interposed therebetween.

In exemplary Embodiment 2, the first power amplifier 61 and the second power amplifier 62 are disposed on the first main surface 101 of the mounting board 100. The high frequency module 1 includes the plurality of electronic components disposed on the first main surface 101 of the mounting board 100. The plurality of electronic components, which are disposed on the first main surface 101 of the mounting board 100, include transmission electronic components related to transmission of the transmission signal. The plurality of electronic components, which are disposed on the first main surface 101 of the mounting board 100, further include a reception electronic component related to reception of the reception signal. The reception electronic components include the third filter 33, the fourth filter 34, the third matching circuit 53, the fourth matching circuit 54, the first low noise amplifier 63, and the second low noise amplifier 64. Particularly, the reception electronic component includes at least one of a filter that passes the reception signal and a low noise amplifier. That is, the third filter 33, the fourth filter 34, the third matching circuit 53, the fourth matching circuit 54, the first low noise amplifier 63, and the second low noise amplifier 64 are disposed on the first main surface 101 of the mounting board 100, in addition to the first power amplifier 61, the second power amplifier 62, the first filter 31, the second filter 32, the first matching circuit 51, and the second matching circuit 52. In a plan view from the thickness direction D1 of the mounting board 100, an outer peripheral shape of each of the third filter 33, the fourth filter 34, the third matching circuit 53, and the fourth matching circuit 54 is a rectangular shape (an oblong shape).

Each of the third filter 33, the fourth filter 34, the third matching circuit 53, and the fourth matching circuit 54 is flip-chip mounted on the first main surface 101 of the mounting board 100. Each of the reception electronic components (the third filter 33, the fourth filter 34, the third matching circuit 53, the fourth matching circuit 54, the first low noise amplifier 63, and the second low noise amplifier 64), which is a plurality of electronic components disposed on the first main surface 101 of the mounting board 100 on which the first power amplifier 61 and the second power amplifier 62 are disposed, is flip-chip mounted on the first main surface 101 of the mounting board 100.

Figure 11:
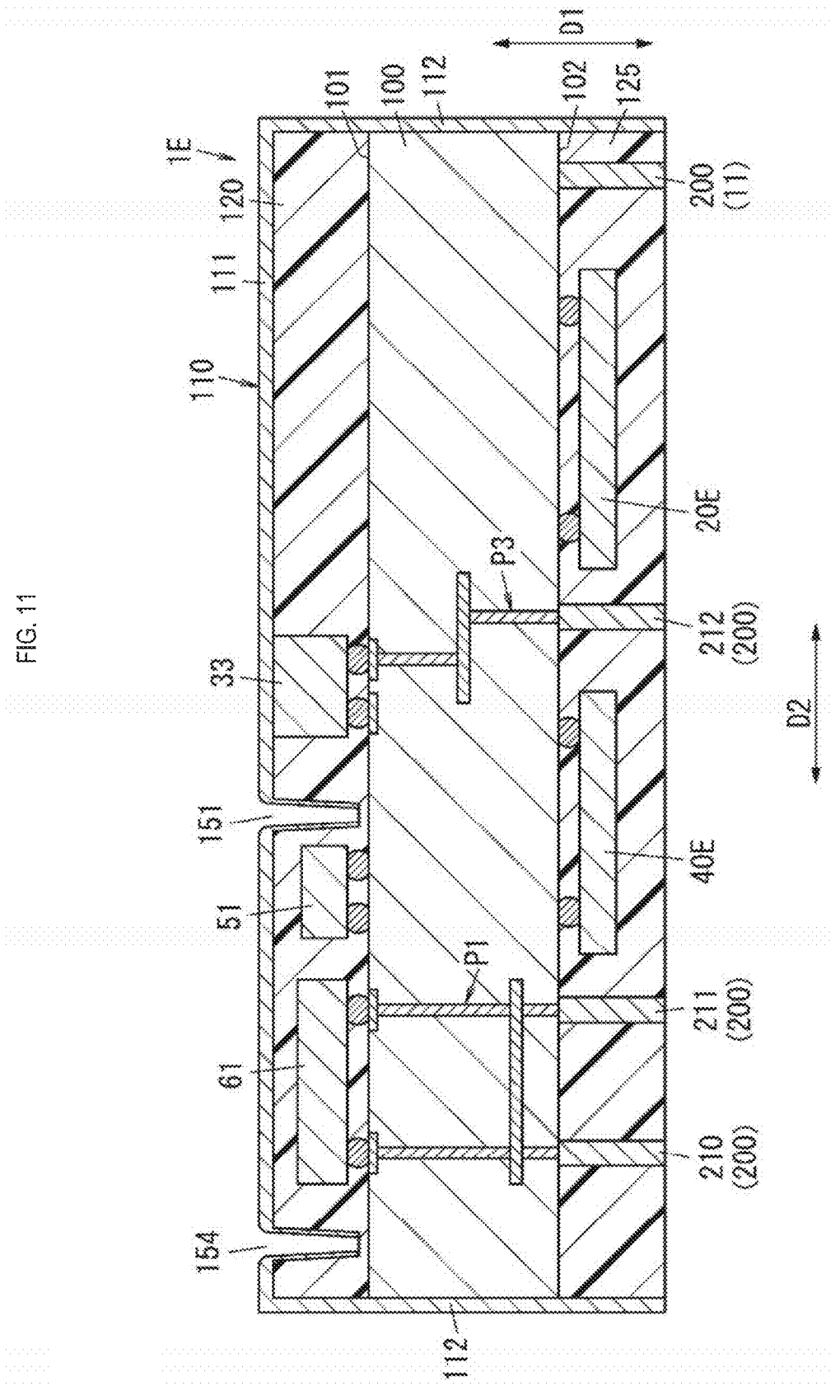
FIG. 11 is a cross-sectional view of the high frequency module same as above.

In exemplary Embodiment 2, the first power amplifier 61, the first matching circuit 51, and the third filter 33 are disposed on the first main surface 101 of the mounting board 100 along the second direction D2 (see FIG. 11). The second power amplifier 62, the second matching circuit 52, and the fourth filter 34 are disposed on the first main surface 101 of the mounting board 100 along the second direction D2 (see FIG. 11). The third filter 33 and the fourth filter 34 are disposed on the first main surface 101 of the mounting board 100 along the third direction D3.

The high frequency module 1E according to exemplary Embodiment 2 further includes a shield layer 110, a first resin layer 120, and a second resin layer 125.

The first resin layer 120 is disposed on a side of the first main surface 101 of the mounting board 100. Specifically, the first resin layer 120 is disposed at least between the first power amplifier 61 and the second power amplifier 62, and the first filter 31 and the second filter 32, in a direction in which the first power amplifier 61 and the second power amplifier 62, and the first filter 31 and the second filter 32 are arranged, in a plan view from the thickness direction D1 of the mounting board 100. Here, the first resin layer 120 covers at least a part of an outer peripheral surface of each of the first filter 31, the second filter 32, the third filter 33, the fourth filter 34, the first matching circuit 51, the second matching circuit 52, the third matching circuit 53, the fourth matching circuit 54, the first power amplifier 61, the second power amplifier 62, the first low noise amplifier 63, and the second low noise amplifier 64. In the first resin layer 120, the groove portion 151 is formed between the first power amplifier 61 and the third filter 33 (see FIG. 11). Similarly, in the first resin layer 120, the groove portion 151 is formed between the second power amplifier 62 and the fourth filter 34.

Further, similar to exemplary Embodiment 1, the second groove portion 152, the third groove portion 153, the fourth groove portion 154, the fifth groove portion 155, and the sixth groove portion 156 are also provided in the first resin layer 120. At this time, the groove portion 151 (the first groove portion), the second groove portion 152, the third groove portion 153, and the fourth groove portion 154 are provided in the first resin layer 120 to surround the first power amplifier 61. The groove portion 151 (the first groove portion), the second groove portion 152, the fifth groove portion 155, and the sixth groove portion 156 are provided in the first resin layer 120 to surround the second power amplifier 62.

The structures of the first groove portion 151 to the sixth groove portion 156 are the same as those in exemplary Embodiment 1, and thus a description thereof will be omitted here.

In the mounting board 100 according to exemplary Embodiment 2, the first ground terminal 211 is connected to the first power amplifier 61. A first path P1 (hereinafter, simply referred to as a "path P1"), which connects the first ground terminal 211 and the first power amplifier 61, does not overlap the groove portion 151 in a plan view from the thickness direction D1 of the mounting board 100 (see FIG. 11). Here, the path P1 is formed of a via conductor and a conductor pattern. Although not shown, the path P1 also does not overlap the second groove portions 152, the third groove portions 153, and the fourth groove portions 154 in a plan view from the thickness direction D1 of the mounting board 100. Further, a path between the first power amplifier 61 and the ground terminal 210 connected to the first power amplifier 61 does not overlap the groove portion 151 (the first groove portion 151), the second groove portion 152, the third groove portion 153, and the fourth groove portion 154 in a plan view from the thickness direction D1 of the mounting board 100.

The second ground terminal 212 is connected to the third filter 33, which is the electronic component. A path P3, which connects the second ground terminal 212 and the third filter 33 that is the electronic component, does not overlap the groove portion 151 in a plan view from the thickness direction D1 of the mounting board 100 (see FIG. 11). Here, the path P3 is formed of a via conductor and a conductor pattern.

Similar to exemplary Embodiment 1, a third path between the second power amplifier 62 and the ground terminal connected to the second power amplifier 62 does not overlap the groove portion 151 in a plan view from the thickness direction D1 of the mounting board 100. Here, the path is formed of a via conductor and a conductor pattern. Further, although not shown, the path does not overlap the second groove portion 152, the fifth groove portion 155, and the sixth groove portion 156 in a plan view from the thickness direction D1 of the mounting board 100.

Further, a path between the fourth filter 34 and the ground terminal connected to the fourth filter 34 does not overlap the groove portion 151 in a plan view from the thickness direction D1 of the mounting board 100. Here, the fourth path is formed of a via conductor and a conductor pattern.

In exemplary Embodiment 2, although the first low noise amplifier 63 and the second low noise amplifier 64 are disposed on the first main surface 101 of the mounting board 100, the present disclosure is not limited to this configuration. The first low noise amplifier 63 and the second low noise amplifier 64 may be disposed on the second main surface 102 of the mounting board 100. When the first low noise amplifier 63 and the second low noise amplifier 64 are disposed on the second main surface 102 of the mounting board 100, the first low noise amplifier 63, the second low noise amplifier 64, and the first switch 20E may be integrated into one chip.

Further, Modification Examples 1 to 6 of exemplary Embodiment 1 are applicable to Embodiment 2.

(Summary)

As described above, a high frequency module (1; 1A; 1B; 1C; 1D; 1E) of a first aspect includes a mounting board (100), a power amplifier (a first power amplifier 61; 610, a second power amplifier 62), an electronic component (for example, a first filter 31, a second filter 32), and a resin layer (for example, a first resin layer 120). The mounting board (100) has a first main surface (101) and a second main surface (102) opposite to each other. The power amplifier is disposed on a main surface of either the first main surface (101) or the second main surface (102) of the mounting board (100). The electronic component is disposed on the main surface of the mounting board (100) on which the power amplifier is disposed. The resin layer is disposed at least between the power amplifier and the electronic component in a plan view from a thickness direction (D1) of the mounting board (100). The power amplifier has a third main surface (for example, an upper surface 61a) and a fourth main surface (for example, a lower surface 61b) opposite to each other in the thickness direction (D1) of the mounting board (100). The fourth main surface of the power amplifier is provided between the third main surface of the power amplifier and the main surface of the mounting board (100) on which the power amplifier is disposed. The groove portion (151) is formed at least between the power amplifier and the electronic component in the resin layer. The groove portion (151) includes a bottom portion (1511) positioned between the third main surface of the power amplifier and the main surface of the mounting board (100) when the mounting board (100) is viewed from a direction (for example, a second direction D2) orthogonal to the thickness direction (D1) of the mounting board (100).

According to the configuration, the bottom portion (1511) of the groove portion (151) is positioned between the third main surface of the power amplifier and the main surface of the mounting board (100) when the mounting board (100) is viewed from a direction orthogonal to the thickness direction (D1) of the mounting board (100), the heat insulation between the power amplifier and electronic component can be further improved.

A second aspect provides the high frequency module (1; 1A; 1B; 1C; 1D; 1E) according to the first aspect, in which a length (L1) of the groove portion (151) is longer than a length (L2) of the power amplifier along a direction in which the groove portion (151) extends, in a plan view from the thickness direction (D1) of the mounting board (100).

According to the configuration, since the length (L1) of the groove portion (151) is longer than the length (L2) of the power amplifier along the direction in which the groove portion (151) extends, the heat insulation between the power amplifier and the electronic component can be further improved.

The high frequency module (1; 1A; 1B; 1C; 1D; 1E) of a third aspect according to the first or second aspect further includes a power amplifier side shield portion (110a) that covers at least a part of the resin layer. The resin layer is provided to cover the power amplifier. The power amplifier side shield portion (110a) covers at least a part of the resin layer. The power amplifier side shield portion (110a) has at least a power amplifier side first shield surface (111a) and a power amplifier side second shield surface (111b). The power amplifier side first shield surface (111a) overlaps the power amplifier in a plan view from the thickness direction (D1) of the mounting board (100). The power amplifier side second shield surface (111b) covers, among a first side wall (121) and a second side wall (122) of the resin layer that face each other in a direction (for example, the second direction D2) in which the power amplifier and the electronic component are arranged and that form the groove portion (151), the first side wall (121) that is closer to the power amplifier.

According to the configuration, the heat insulation between the power amplifier and the electronic component can be further improved, and it is possible to further reduce the leakage of the signal from the power amplifier as noise from the first side wall (121).

A fourth aspect provides the high frequency module (1; 1A; 1B; 1C; 1D; 1E) according to the third aspect, in which a connection part between the power amplifier side first shield surface (111a) and the power amplifier side second shield surface (111b) is formed in an R shape.

According to the configuration, the heat insulation between the power amplifier and the electronic component can be further improved.

A fifth aspect provides the high frequency module (1; 1A; 1B; 1C; 1D; 1E) according to the third or fourth aspect, in which a thickness (T11) of the power amplifier side second shield surface (111b) is smaller than a thickness (T12) of the power amplifier side first shield surface (111a).

According to the configuration, it is possible to improve the heat dissipation from the power amplifier side second shield surface (111b) while reducing the leakage of the signal as noise from the power amplifier side first shield surface (111a).

A sixth aspect provides the high frequency module (1; 1A; 1B; 1C; 1D; 1E) according to any one of the first to fifth aspects, in which the bottom portion (1511) of the groove portion (151) is positioned between the fourth main surface of the power amplifier and the main surface of the mounting board (100) when the mounting board (100) is viewed from the direction (for example, the second direction D2) orthogonal to the thickness direction (D1) of the mounting board (100).

According to the configuration, the bottom portion (1511) of the groove portion (151) is positioned between the fourth main surface of the power amplifier and the main surface of the mounting board (100) when the mounting board (100) is viewed from a direction orthogonal to the thickness direction (D1) of the mounting board (100), the heat insulation between the power amplifier and electronic component can be further improved. Particularly, the present disclosure is effective when the power amplifier is flip-chip mounted.

A seventh aspect provides the high frequency module (1; 1A; 1B; 1C; 1D; 1E) according to any one of the first to sixth aspects, in which a diameter (L12) of the bottom portion (1511) of the groove portion (151) is smaller than a diameter (L11) of an opening surface of the groove portion (151).

According to the configuration, since the diameter (L12) of the bottom portion (1511) of the groove portion (151) is smaller than the diameter (L11) of the opening surface of the groove portion (151), heat transmitted from an upper side of the power amplifier to the electronic component can be reduced. As a result, the heat insulation between the power amplifier and the electronic component can be further improved.

An eighth aspect provides the high frequency module (1D) according to any one of the first to seventh aspects, in which the resin layer is provided to cover the power amplifier. A second groove portion (152), a third groove portion (153), and a fourth groove portion (154), which are different from a first groove portion (151), are provided in the resin layer as the groove portion (151). The second groove portion (152) extends in a direction away from the electronic component, from one end portion among both end portions of the first groove portion (151). The third groove portion (153) extends in a direction away from the electronic component, from the other end portion among the both end portions of the first groove portion (151). The fourth groove portion (154) is provided to connect an end portion of the second groove portion (152) and an end portion of the third groove portion (153). The first groove portion (151), the second groove portion (152), the third groove portion (153), and the fourth groove portion (154) are formed to surround the power amplifier in a plan view from the thickness direction (D1) of the mounting board (100).

According to this configuration, since the first groove portion (151), the second groove portion (152), the third groove portion (153), and the fourth groove portion (154) surround the power amplifier in a plan view from the thickness direction (D1) from the mounting board (100), the heat insulation between the power amplifier and electronic components can be further improved.

The high frequency module (1; 1A; 1B; 1E) of a ninth aspect according to any one of the first to seventh aspects further includes a second power amplifier (62), which is different from a first power amplifier (61; 610), as the power amplifier. The second power amplifier (62) is disposed on the main surface of the mounting board (100) on which the first power amplifier (61) is disposed and is disposed on a side of the first power amplifier (61; 610) with respect to the groove portion (151).

According to the configuration, similar to the first power amplifier (61; 610), the heat insulation between the second power amplifier (62) and the electronic component can be further improved.

A tenth aspect provides the high frequency module (1; 1A; 1B; 1E) according to ninth aspect, in which the resin layer is provided to cover the first power amplifier (61; 610) and the second power amplifier (62). A second groove portion (152), which is different from a first groove portion (151), is provided between the first power amplifier (61; 610) and the second power amplifier (62) in the resin layer as the groove portion (151), in a plan view from the thickness direction (D1) of the mounting board (100).

According to the configuration, it is possible to reduce thermal interference between the two power amplifiers while further improving the heat insulation between the power amplifier and the electronic component.

An eleventh aspect provides the high frequency module (1; 1A; 1B; 1E) according to tenth aspect, in which a third groove portion (153), a fourth groove portion (154), a fifth groove portion (155), and a sixth groove portion (156), which are different from the first groove portion (151) and the second groove portion (152), are provided in the resin layer. One end portion among both end portions of the second groove portion (152) is connected to the first groove portion (151). The third groove portion (153) extends in a direction away from the electronic component, from one end portion among both end portions of the first groove portion (151). The fourth groove portion (154) is provided to connect the other end portion among the both end portions of the second groove portion (152) and an end portion of the third groove portion (153). The fifth groove portion (155) extends in a direction away from the electronic component, from the other end portion among the both end portions of the first groove portion (151). The sixth groove portion (156) is provided to connect the other end portion among the both end portions of the second groove portion (152) and an end portion of the fifth groove portion (155). The first groove portion (151), the second groove portion (152), the third groove portion (153), and the fourth groove portion (154) are formed to surround the first power amplifier (61; 610) in the plan view from the thickness direction (D1) of the mounting board (100). The first groove portion (151), the second groove portion (152), the fifth groove portion (155), and the sixth groove portion (156) are formed to surround the second power amplifier (62) in the plan view from the thickness direction (D1) of the mounting board (100).

According to the configuration, it is possible to reduce thermal interference between the two power amplifiers while further improving the heat insulation between the power amplifier and the electronic component.

The high frequency module (1; 1A; 1B; 1C; 1D; 1E) of a twelfth aspect according to any one of the first to eleventh aspects further includes an electronic component side shield portion (110b). The resin layer is provided to cover the electronic component. The electronic component side shield portion (110b) covers at least a part of the resin layer. The electronic component side shield portion (110b) has at least an electronic component side first shield surface (111c) and an electronic component side second shield surface (111d). The electronic component side first shield surface (111c) overlaps the electronic component in a plan view from the thickness direction (D1) of the mounting board (100). The electronic component side second shield surface (111d) covers, among a first side wall (121) and a second side wall (122) of the resin layer that face each other in a direction (for example, the second direction D2) in which the power amplifier and the electronic component are arranged and that form the groove portion (151), the second side wall (122) that is closer to the electronic component.

According to the configuration, the heat insulation between the power amplifier and the electronic component can be further improved, and it is possible to further reduce the entering of the signal from the power amplifier as noise from the second side wall (122).

A thirteenth aspect provides the high frequency module (1; 1A; 1B; 1C; 1D; 1E) according to twelfth aspect, in which a connection part between the electronic component side first shield surface (111c) and the electronic component side second shield surface (111d) is formed in an R shape.

According to the configuration, the heat insulation between the power amplifier and the electronic component can be further improved.

A fourteenth aspect provides the high frequency module (1; 1A; 1B; 1C; 1D; 1E) according to twelfth or thirteenth aspect, in which at least a part of the electronic component is in contact with the electronic component side shield portion (110b).

According to the configuration, it is possible to reduce characteristic fluctuations due to temperature while improving the heat dissipation of the electronic component.

A fifteenth aspect provides the high frequency module (1; 1A; 1B; 1C; 1D; 1E) according to any one of the first to fourteenth aspects, in which the mounting board (100) includes a first ground terminal (211) and a second ground terminal (212) that are connected to a ground. The first ground terminal (211) is connected to the power amplifier. A path (a first path P1), which connects the first ground terminal (211) and the power amplifier, does not overlap the groove portion (151) in a plan view from the thickness direction (D1) of the mounting board (100).

According to this configuration, in the inside of the mounting board (100), it is possible to reduce the propagation of heat, which is generated in the path (the first path P1) connecting the first ground terminal (211) and the power amplifier, to the electronic component with the inside of the mounting board (100) interposed therebetween.

A sixteenth aspect provides the high frequency module (1; 1A; 1B; 1C; 1D; 1E) according to fifteenth aspect, in which the second ground terminal (212) is connected to the electronic component. A path (a second path P2), which connects the second ground terminal (212) and the electronic component, does not overlap the groove portion (151) in the plan view from the thickness direction (D1) of the mounting board (100).

According to the configuration, in the inside the mounting board (100), it is possible to reduce the propagation of heat, which is generated in the power amplifier, to the electronic component with the path (the second path P2), which connects the second ground terminal (212) and the electronic component, interposed therebetween.

A seventeenth aspect provides the high frequency module (1; 1A; 1B; 1C; 1D) according to any one of the first to sixth aspects, in which the electronic component is a transmission electronic component (for example, a first filter 31, a second filter 32) related to transmission of a transmission signal.

According to the configuration, it is possible to reduce characteristic fluctuations due to temperature with respect to the transmission electronic component.

An eighteenth aspect provides the high frequency module (1E) according to any one of the first to seventeenth aspects, in which the electronic component is a reception electronic component (for example, a first low noise amplifier 63, a second low noise amplifier 64, a third filter 33, a fourth filter 34) related to reception of a reception signal.

According to the configuration, it is possible to reduce characteristic fluctuations due to temperature with respect to the reception electronic component.

A nineteenth aspect provides the high frequency module (1; 1A; 1B; 1C; 1D; 1E) according to any one of the first to eighteenth aspects, in which among a first side wall (121) and a second side wall (122) of the resin layer that face each other in a direction (for example, a second direction D2) in which the power amplifier and the electronic component are arranged and that form the groove portion (151), a thickness (T1) of the first side wall (121) that is closer to the power amplifier is smaller than a thickness (T2) of the second side wall (122) that is closer to the electronic component among the first side wall (121) and the second side wall (122).

According to the configuration, the heat insulation between the power amplifier and the electronic component can be further improved.

A communication device (500) of a twentieth aspect includes the high frequency module (1; 1A; 1B; 1C; 1D; 1E) according to any one of the first to nineteenth aspects; and a signal processing circuit (501). The signal processing circuit (501) processes a high frequency signal passing through the high frequency module (1; 1A; 1B; 1C; 1D; 1E).

According to the configuration, the heat insulation between the power amplifier and the electronic component can be further improved.

REFERENCE SIGNS LIST 1, 1A, 1B, 1C, 1D, 1E High frequency module
11 First antenna terminal
12 Second antenna terminal
16 First power amplifier
20, 20E First switch
21 First common terminal
22 First selection terminal
22a Reception side first selection terminal
23 First selection terminal
23a Reception side first selection terminal
25 Second common terminal
26 Second selection terminal
26a Reception side second selection terminal
27 Second selection terminal
27a Reception side second selection terminal
31 First filter
31a First transmission filter (transmission electronic component, transmission filter)
31b Second transmission filter (transmission electronic component, transmission filter)
32 Second filter
32a Third transmission filter
32b Fourth transmission filter
33 Third filter (reception electronic component, reception filter)
33a First reception filter
33b Second reception filter
34 Fourth filter (reception electronic component, reception filter)
34a Third reception filter
34b Fourth reception filter
40, 40E Second switch
41 Third switch
41a Third common terminal
41b, 40c Third selection terminal
42 Fourth switch
42a Fourth common terminal
42b, 42c Fourth selection terminal
43 Fifth switch
43a Fifth common terminal
43b, 43c Fifth selection terminal
44 Sixth switch
44a Sixth common terminal
44b, 44c Sixth selection terminal 51 First matching circuit (transmission electronic component)
52 Second matching circuit (transmission electronic component)
53 Third matching circuit
54 Fourth matching circuit
61 First power amplifier (power amplifier)
61a Upper surface (third main surface)
61b Lower surface (fourth main surface)
62 Second power amplifier
63 First low noise amplifier (reception electronic component, low noise amplifier)
64 Second low noise amplifier (reception electronic component, low noise amplifier)
71, 72 Signal input terminal
73, 74 Signal output terminal
100 Mounting board
101 First main surface
102 Second main surface
110 Shield layer
110a Power amplifier side shield portion
110b Electronic component side shield portion
111a Power amplifier side first shield surface
111b Power amplifier side second shield surface
111c Electronic component side first shield surface
111d Electronic component side second shield surface
120 First resin layer (resin layer)
121 First side wall
122 Second side wall
125 Second resin layer
151 Groove portion (first groove portion)
151a, 151b Groove portion
152 Second groove portion
153 Third groove portion
154 Fourth groove portion
155 Fifth groove portion
156 Sixth groove portion
200 External connection terminal
210 Ground terminal
211 First ground terminal (ground terminal)
212 Second ground terminal (ground terminal)
250 Ball bump
311 Upper surface
312 Lower surface
500, 500E Communication device
501 Signal processing circuit
502 RF signal processing circuit
503 Baseband signal processing circuit
511 First antenna
512 Second antenna
610 First power amplifier
610a Upper surface
611 Wire
612 Wire
1511 Bottom portion
D1 Thickness direction (first direction)
D2 Second direction
D3 Third direction
H1 First distance
H2, H12 Second distance
H3 Third distance
L1, L2 Length
L11, L12 Diameter
P1 First path
P2 Second path
P11, P12 Path

The invention claimed is:

1. A high frequency module comprising:

a mounting board that has a first main surface opposite to a second main surface;

a power amplifier that is disposed on a main surface of either the first main surface or the second main surface of the mounting board;

an electronic component that is disposed on the main surface of the mounting board on which the power amplifier is disposed; and a resin layer that is disposed at least between the power amplifier and the electronic component in a plan view from a thickness direction of the mounting board, wherein the power amplifier has a third main surface opposite to a fourth main surface in the thickness direction of the mounting board, the fourth main surface of the power amplifier is provided between the third main surface of the power amplifier and the main surface of the mounting board on which the power amplifier is disposed, a groove portion is formed at least between the power amplifier and the electronic component, in the resin layer, the groove portion includes a bottom portion positioned between the third main surface of the power amplifier and the main surface of the mounting board when the mounting board is viewed from a direction orthogonal to the thickness direction of the mounting board, the resin layer is provided to cover the power amplifier, a second groove portion, a third groove portion, and a fourth groove portion, which are different from a first groove portion, are provided in the resin layer as the groove portion, the second groove portion extends in a direction away from the electronic component, from one end portion among both end portions of the first groove portion, the third groove portion extends in a direction away from the electronic component, from the other end portion among the both end portions of the first groove portion, the fourth groove portion is provided to connect an end portion of the second groove portion and an end portion of the third groove portion, and the first groove portion, the second groove portion, the third groove portion, and the fourth groove portion are formed to surround the power amplifier in a plan view from the thickness direction of the mounting board.

2. The high frequency module according to claim 1, wherein a length of the groove portion is longer than a length of the power amplifier along a direction in which the groove portion extends, in a plan view from the thickness direction of the mounting board.

3. The high frequency module according to claim 1, wherein the high frequency module further comprises a power amplifier side shield portion that covers at least a part of the resin layer, the power amplifier side shield portion has at least a power amplifier side first shield surface and a power amplifier side second shield surface, the power amplifier side first shield surface overlaps the power amplifier in a plan view from the thickness direction of the mounting board, and the power amplifier side second shield surface covers, among a first side wall and a second side wall of the resin layer that faces the first side wall in a direction in which the power amplifier and the electronic component are arranged and that form the groove portion, the first side wall that is closer to the power amplifier than the second wall.

4. The high frequency module according to claim 3, wherein a connection part between the power amplifier side first shield surface and the power amplifier side second shield surface is formed in an R shape.

5. The high frequency module according to claim 3, wherein a thickness of the power amplifier side second shield surface is smaller than a thickness of the power amplifier side first shield surface.

6. The high frequency module according to claim 1, wherein the bottom portion of the groove portion is positioned between the fourth main surface of the power amplifier and the main surface of the mounting board when the mounting board is viewed from the direction orthogonal to the thickness direction of the mounting board.

7. The high frequency module according to claim 1, wherein a diameter of the bottom portion of the groove portion is smaller than a diameter of an opening surface of the groove portion.

8. The high frequency module according to claim 1, further comprising:

a second power amplifier, which is different from a first power amplifier, as the power amplifier, wherein the second power amplifier is disposed on the main surface of the mounting board on which the first power amplifier is disposed and is disposed on a side of the first power amplifier with respect to the groove portion.

9. The high frequency module according to claim 8, wherein the resin layer is provided to cover the first power amplifier and the second power amplifier, and the second groove portion, which is different from a first groove portion, is provided between the first power amplifier and the second power amplifier in the resin layer as the groove portion, in a plan view from the thickness direction of the mounting board.

10. The high frequency module according to claim 1, wherein the resin layer is provided to cover the electronic component, the high frequency module further comprises an electronic component side shield portion that covers at least a part of the resin layer, the electronic component side shield portion has at least an electronic component side first shield surface and an electronic component side second shield surface, the electronic component side first shield surface overlaps the electronic component in a plan view from the thickness direction of the mounting board, and the electronic component side second shield surface covers, among a first side wall and a second side wall of the resin layer that faces the first side wall in a direction in which the power amplifier and the electronic component are arranged and that form the groove portion, the second side wall that is closer to the electronic component than the first side wall.

11. The high frequency module according to claim 10, wherein a connection part between the electronic component side first shield surface and the electronic component side second shield surface is formed in an R shape.

12. The high frequency module according to claim 1, wherein the mounting board includes a first ground terminal and a second ground terminal that are connected to a ground, the first ground terminal is connected to the power amplifier, and a path, which connects the first ground terminal and the power amplifier, does not overlap the groove portion in a plan view from the thickness direction of the mounting board.

13. The high frequency module according to claim 12, wherein the second ground terminal is connected to the electronic component, and a path, which connects the second ground terminal and the electronic component, does not overlap the groove portion in the plan view from the thickness direction of the mounting board.

14. The high frequency module according to claim 1, wherein the electronic component is a transmission electronic component related to transmission of a transmission signal.

15. The high frequency module according to claim 1, wherein the electronic component is a reception electronic component related to reception of a reception signal.

16. The high frequency module according to claim 1, wherein among a first side wall and a second side wall of the resin layer that faces the first side wall in a direction in which the power amplifier and the electronic component are arranged and that form the groove portion, a thickness of the first side wall that is closer to the power amplifier is smaller than a thickness of the second side wall that is closer to the electronic component among the first side wall and the second side wall.

17. A communication device comprising:

the high frequency module according to claim 1; and a signal processing circuit that processes a high frequency signal passing through the high frequency module.

18. A high frequency module comprising:

a mounting board that has a first main surface opposite to a second main surface;

a power amplifier that is disposed on a main surface of either the first main surface or the second main surface of the mounting board;

an electronic component that is disposed on the main surface of the mounting board on which the power amplifier is disposed; and a resin layer that is disposed at least between the power amplifier and the electronic component in a plan view from a thickness direction of the mounting board, wherein the power amplifier has a third main surface opposite to a fourth main surface in the thickness direction of the mounting board, the fourth main surface of the power amplifier is provided between the third main surface of the power amplifier and the main surface of the mounting board on which the power amplifier is disposed, a groove portion is formed at least between the power amplifier and the electronic component, in the resin layer, the groove portion includes a bottom portion positioned between the third main surface of the power amplifier and the main surface of the mounting board when the mounting board is viewed from a direction orthogonal to the thickness direction of the mounting board, wherein the high frequency module further comprises a second power amplifier, which is different from a first power amplifier, as the power amplifier, the second power amplifier is disposed on the main surface of the mounting board on which the first power amplifier is disposed and is disposed on a side of the first power amplifier with respect to the groove portion, the resin layer is provided to cover the first power amplifier and the second power amplifier, the second groove portion, which is different from a first groove portion, is provided between the first power amplifier and the second power amplifier in the resin layer as the groove portion, in a plan view from the thickness direction of the mounting board, a third groove portion, a fourth groove portion, a fifth groove portion, and a sixth groove portion, which are different from the first groove portion and the second groove portion, are provided in the resin layer, one end portion among both end portions of the second groove portion is connected to the first groove portion, the third groove portion extends in a direction away from the electronic component, from one end portion among both end portions of the first groove portion, the fourth groove portion is provided to connect the other end portion among the both end portions of the second groove portion and an end portion of the third groove portion, the fifth groove portion extends in a direction away from the electronic component, from the other end portion among the both end portions of the first groove portion, the sixth groove portion is provided to connect the other end portion among the both end portions of the second groove portion and an end portion of the fifth groove portion, the first groove portion, the second groove portion, the third groove portion, and the fourth groove portion are formed to surround the first power amplifier in the plan view from the thickness direction of the mounting board, and the first groove portion, the second groove portion, the fifth groove portion, and the sixth groove portion are formed to surround the second power amplifier in the plan view from the thickness direction of the mounting board.

19. A high frequency module comprising:

a mounting board that has a first main surface opposite to a second main surface;

a power amplifier that is disposed on a main surface of either the first main surface or the second main surface of the mounting board;

an electronic component that is disposed on the main surface of the mounting board on which the power amplifier is disposed; and a resin layer that is disposed at least between the power amplifier and the electronic component in a plan view from a thickness direction of the mounting board, wherein the power amplifier has a third main surface opposite to a fourth main surface in the thickness direction of the mounting board, the fourth main surface of the power amplifier is provided between the third main surface of the power amplifier and the main surface of the mounting board on which the power amplifier is disposed, a groove portion is formed at least between the power amplifier and the electronic component, in the resin layer, the groove portion includes a bottom portion positioned between the third main surface of the power amplifier and the main surface of the mounting board when the mounting board is viewed from a direction orthogonal to the thickness direction of the mounting board, wherein the resin layer is provided to cover the electronic component, the high frequency module further comprises an electronic component side shield portion that covers at least a part of the resin layer, the electronic component side shield portion has at least an electronic component side first shield surface and an electronic component side second shield surface, the electronic component side first shield surface overlaps the electronic component in a plan view from the thickness direction of the mounting board, the electronic component side second shield surface covers, among a first side wall and a second side wall of the resin layer that faces the first side wall in a direction in which the power amplifier and the electronic component are arranged and that form the groove portion, the second side wall that is closer to the electronic component than the first side wall, and at least a part of the electronic component is in contact with the electronic component side shield portion.

* * * * *